(12) United States Patent
Kobayashi et al.

(10) Patent No.: US 6,721,205 B2
(45) Date of Patent: Apr. 13, 2004

(54) NONVOLATILE SEMICONDUCTOR MEMORY DEVICE AND METHODS FOR OPERATING AND PRODUCING THE SAME

(75) Inventors: Toshio Kobayashi, Kanagawa (JP); Hiroyuki Moriya, Kanagawa (JP); Ichiro Fujiwara, Kanagawa (JP)

(73) Assignee: Sony Corporation (JP)

( * ) Notice: Subject to any disclaimer, the term of this patent is extended or adjusted under 35 U.S.C. 154(b) by 27 days.

(21) Appl. No.: 09/735,938

(22) Filed: Dec. 14, 2000

(65) Prior Publication Data

US 2003/0161192 A1 Aug. 28, 2003

(30) Foreign Application Priority Data

Sep. 12, 2000 (JP) .................................. P2000-276305
Nov. 2, 2000 (JP) .................................. P2000-336774

(51) Int. Cl.[7] .............................................. G11C 16/04
(52) U.S. Cl. ............................. 365/185.26; 365/185.24
(58) Field of Search ....................... 365/185.26, 185.24, 365/149, 212

(56) References Cited

PUBLICATIONS

Eitan, Boaz, Paola Pavan, Ilan Bllom, Efraim Aloni, Aviv Frommer and David Finzi. *Can NROM, a 2–Bit, Trapping Storage NVM Cell, Give a Real Challenge to Floating Gate Cells?*. 1999 International Conference on Solid State Device and Materials, Tokyo, 1999, pp. 5220524.

*Primary Examiner*—Thong Q. Le
(74) *Attorney, Agent, or Firm*—Rader, Fishman & Grauer PLLC; Ronald P. Kananen

(57) ABSTRACT

A nonvolatile semiconductor memory device with high reliability (free from troubles in storing data), a high charge injection efficiency, and enabling parallel operation in a VG cell array, includes channel forming regions, a charge storing film which consists of stacked dielectric films and is capable of storing a charge, two storage portions forming parts of the charge storing film and overlapping the channel forming regions, a single layer dielectric film between the storage portions and in contact with the channel forming region, a control gate electrode on the single layer dielectric film, and a memory gate electrode on the storage portions.

40 Claims, 21 Drawing Sheets

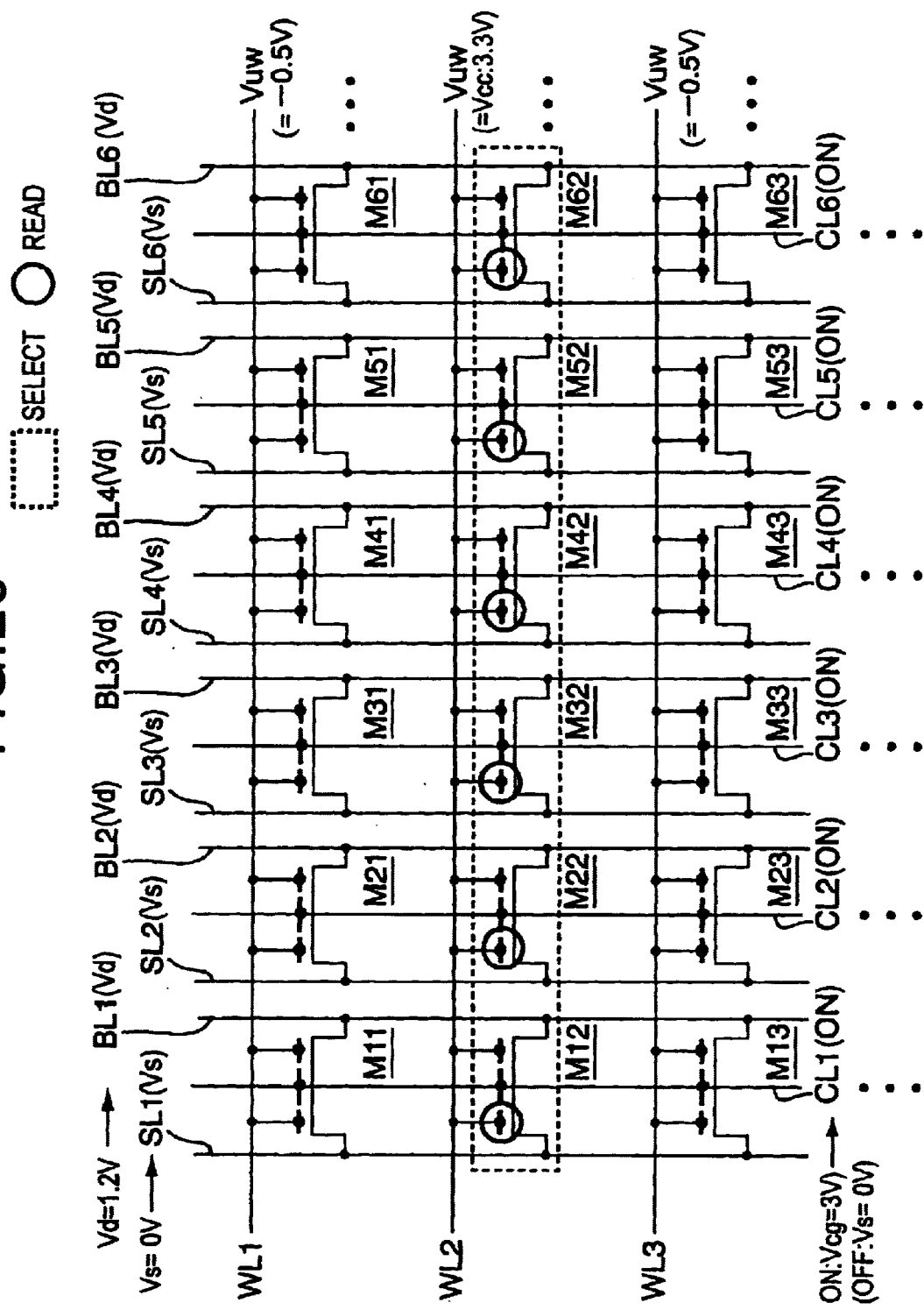

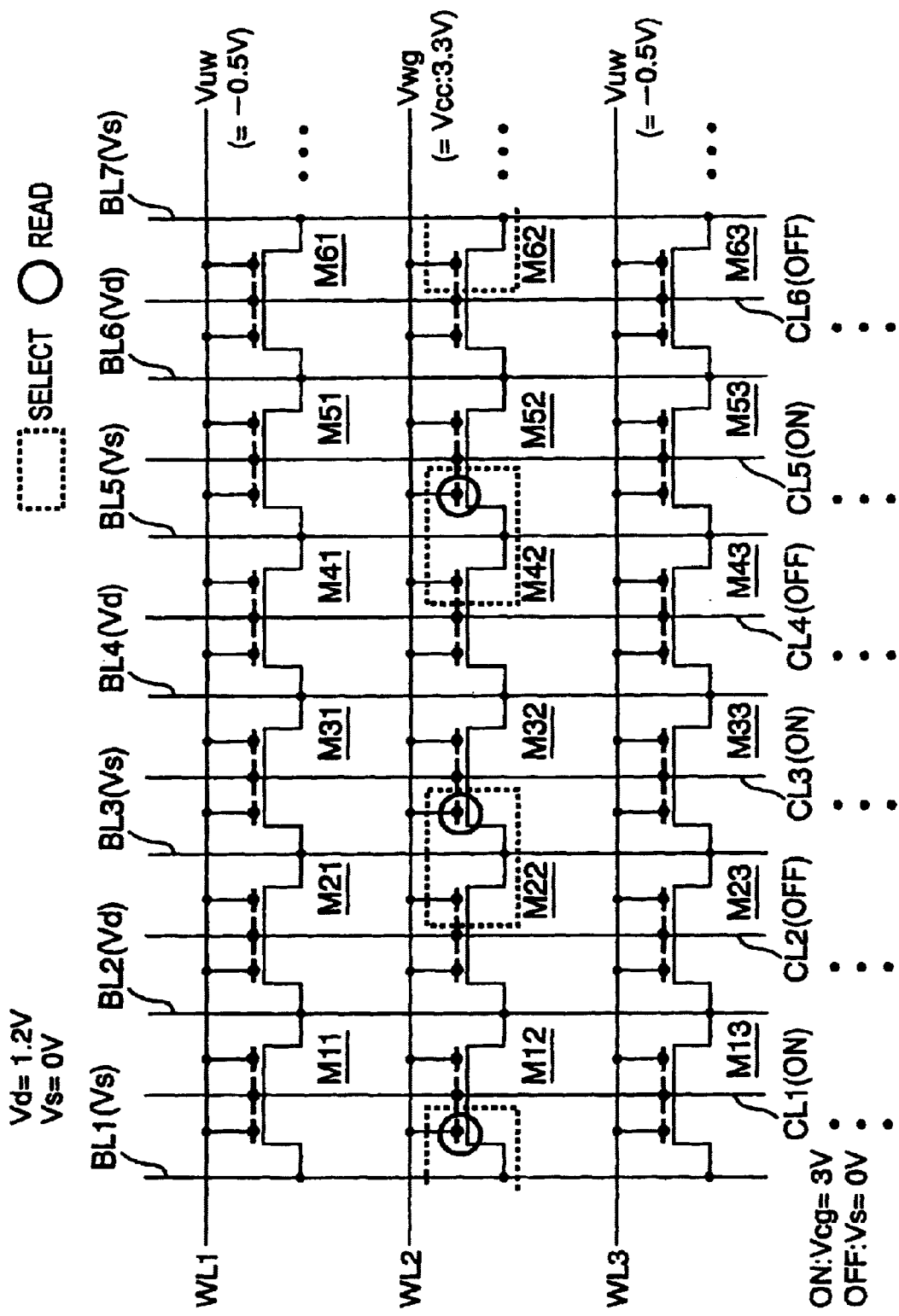

NONVOLATILE SEMICONDUCTOR MEMORY DEVICE AND METHODS FOR OPERATING AND PRODUCING THE SAME

BACKGROUND OF THE INVENTION

1. Field of the Invention

The present invention relates to a nonvolatile semiconductor memory device having a memory cell provided with a storage portion comprised of films having a charge storing capability at both of the two impurity regions forming a source or drain and capable of recording 2 bits of data per cell and methods for operating and producing the same.

2. Descriptions of the Related Art

As a nonvolatile semiconductor memory device, there is well known, for example, a so-called metal-oxide-nitride-oxide-semiconductor (MONOS) type memory or a metal-nitride-oxide-semiconductor (MNOS) type wherein, as a charge storing means for storing data, an insulating film formed by stacking a plurality of films is provided. In the MONOS type memory device, an oxide-nitride-oxide (ONO) film and a gate electrode are stacked on a semiconductor forming a transistor channel, for example, a semiconductor substrate, a well, or a silicon on insulator (SOI) layer (hereinafter referred to merely as a "substrate") and source and drain regions having a conductivity type opposite to the substrate are formed in surface regions of the substrate at the two sides of the stacked pattern.

By injecting a charge into an insulating film having a charge storing capability from the substrate side, writing of data is performed. Erasure is achieved by extracting the stored charge to the substrate side or by injecting an opposite polarity charge into the insulating film to cancel the stored charge.

For injection of the charge into the isolation film, there is known a method of using a charge tunneling phenomenon caused inside an insulator and also, for example, so-called channel-hot-electron (CHE) injection and other methods of exciting a charge in energy up to a degree capable of overcoming the insulating barrier of the bottommost oxide film of an ONO film and so on.

Recently, technology taking note of the fact that conventional CHE injection enables injection of a charge into part of a discrete trap area including dispersed charge traps, and enabling storage of 2 bits per memory cell by independently writing binary data to a source side and a drain side of a charge storing means, that is, the stacked insulating film having the charge storing capability, has been reported.

For example, Extended Abstract of the 1999 International Conference on Solid State Device and Materials, Tokyo, 1999, pp. 522–523, considers that it is possible to reliably read 2 bits of data of small amounts of stored charges by the so-called "reverse read" method by changing the direction of the voltage applied between the source and the drain to write 2 bits of data by CHE injection and, when reading, applying a specified voltage between the source and the drain in a direction reverse to that of the write operation to independently read the 2 bits of data. Further, erasure is performed by forming an inversion layer in a surface region of the source or drain impurity region, causing a high energy charge (hot holes) by avalanche breakdown in the inversion layer, and injecting the hot holes into the charge storing means.

By using this technique, it becomes possible to increase the write speed and greatly reduce the cost per bit.

However, in this memory cell able to store 2 bits of data using conventional CHE injection, the charge storing film (ONO film) is formed on the entire surface of the channel forming region, so the region in which the charge is injected is not limited. Therefore, when the amount of stored charge fluctuates due to the process of the device or nonuniformity of the-bias conditions at the time of operation, this easily can have a delicate effect on the storage characteristics, for example, the change in the threshold voltage. Particularly, when more than the required charge is injected, the change in characteristic at the over-write side becomes a problem since the charge storage region is not limited. Further, since the charge storage region is not limited, there is the disadvantage that the erasure time also becomes long.

Further, a charge trapped in a carrier trap of the charge storing film itself moves much less easily than a charge in a conductive layer, but if the device is held at a high temperature for a long period, so-called "dilution" of storage will occur where there is a certain drift due to heat and the charge retention region expands. In this case as well, in a conventional device structure where the charge storing film is formed uniformly with respect to the entire channel forming region, the relative magnitude of the threshold voltages changes delicately.

There is known that the efficiency of charge injection in conventional CHE injection is a poor one of about $1 \times 10^{-6}$. Thus, in a write operation, a large current is required to be passed between the source drain regions in the memory cell. Therefore, there was the problem of the power consumption becoming larger.

On the other hand, in the above conventional memory cell structure, when using a so-called virtual ground (VG) cell array, one type of array with the smallest cell area, while random access makes it possible to enable selection of any one of a plurality of memory cells connected to a single word line, it suffers from the disadvantage that serial access for simultaneously accessing a plurality of memory cells is not possible.

This is due to the fact that in a VG cell array, the source and the drain regions are shared between two adjoining memory cells in the word line direction. This shared relation is repeated in the word line direction. Namely, in a VG cell array, viewed in the word line direction, source and drain regions and channel forming regions having different conductivity types are alternately repeated. Therefore, when determining the voltages in the two source and drain regions in a certain memory cell, to prevent unintentional operation of other memory cells of the same row, the potentials of the other source and drain regions are also inevitably determined. Therefore, leaving aside memory cells for which the intended operation is possible coincidentally under the relative potentials, access to other memory cells basically becomes impossible. Further, conditional serial access where the accessible cells are constantly changing depending on the logic of the stored data is not practical.

For the above reason, when constructing a VG cell array by memory cells of the above conventional structure, it is not possible to freely and independently operate a plurality of memory cells connected to the same word line. As the result, with conventional memory cells, when constructing a VG cell array so as to reduce the cell area, it suffers from the disadvantage of a large number of write operations when writing data to all memory cells connected to one word line and a longer total time required for writing. That is, the superiority in the reduction of the bit cost obtained by use of a VG cell array to reduce the cell area ends up becoming smaller when not using a VG cell array and raising the write efficiency by serial access.

SUMMARY OF THE INVENTION

A first object of the present invention is to provide a nonvolatile semiconductor memory device which limits the range of a charge retention region which can store 2 bits of data and is less influenced in characteristics even if an excessive charge is injected and methods for operating and producing the same.

A second object of the present invention is to provide a nonvolatile semiconductor memory device which is raised in efficiency of charge injection, improved in write speed, and reduced in the power consumed by a memory cell in a write operation and methods for operating and producing the same.

A third object of the present invention is to provide a nonvolatile semiconductor memory device which is provided with a means for controlling an ON/OFF state of a channel separate from a normal gate electrode of a memory transistor and which thereby enables serial access of a plurality of memory cells connected with one word line even when using a VG cell array and a method for operating the same.

To achieve the first and second objects, according to a first aspect of the present invention, there is provided a nonvolatile semiconductor memory device comprising a channel forming region comprised of a semiconductor; a charge storing film including a plurality of stacked dielectric films and having a charge storing capability; two storage portions comprised of regions of the charge storing film overlapping the two ends of the channel forming region; a single layer dielectric film contacting the channel forming region between the storage portions; a control gate electrode contacting the single layer dielectric film; and a memory gate electrode contacting the two storage portions and having portions contacting the storage portions electrically connected with each other.

The channel forming region comprises two outside channel regions facing the memory gate electrode across the storage portion and an inside channel region located between the two outside channel regions and facing the control gate electrode across the single layer dielectric film.

Preferably, the threshold voltages of the three channel regions consisting of the two outside channel regions and the inside channel region are set independently. For example, the threshold voltages of the two outside channel regions are equal.

In this case, preferably, the threshold voltages of the two outside channel regions are lower than that of the inside channel region.

Further, preferably, the channel forming region comprises two outside channel regions facing the memory gate electrode across the storage portion and an inside channel region located between the two outside channel regions and facing the control gate electrode across the single layer dielectric film and wherein a length of the inside channel region defined by the distance between the two outside channel regions is a length enabling carriers to run quasi-ballistically in a channel formed at the time of operation.

The memory gate electrode preferably intersects the control gate electrode in an electrically insulated state and contacts the storage portions at both the outsides of the control gate electrode.

In this case, preferably the device further comprises on the control gate electrode an etching stop layer comprised of a dielectric within etching rate lower than that of a conductive material forming the memory gate electrode.

This is for preventing removal of the dielectric film on the control gate electrode and etching down to the control gate electrode at the time of processing the memory gate electrode.

Preferably, further provision is made of two impurity regions separated from each other from the storage portion sides across the channel forming region and comprised of a semiconductor having a reverse conductivity type to the channel forming region; the two impurity regions are bit lines; the memory gate electrode is a word line for controlling operations including input and output of charges to or from the storage portions; and the control gate electrode is a control line for assisting the operations.

A so-called NOR type memory cell array can be adopted. In this case, the memory cell comprises two impurity regions isolated from each other across the channel forming region from the storage portion sides and comprised of a semiconductor having a conductivity type opposite to the channel forming region; a control transistor having the control gate electrode as a gate and functioning to make two outside channel regions facing the memory gate electrode across the storage portions the source and the drain; and two memory transistors connected in series across the control transistor, each having the memory gate electrode as the gate, and each functioning to make the channel region of the control transistor and one of the two impurity regions as a source or a drain, a plurality of such memory cells being arranged in a matrix to form a memory cell array; each of the two impurity regions being arranged longwise in one direction of the memory cell array and being shared among a plurality of memory cells; and the control gate electrode being arranged in the space separating the two impurity regions parallel to the impurity regions and is shared among the plurality of memory cells.

Further, preferably each of the two impurity regions is isolated from an impurity region of another memory cell adjoining in a direction perpendicular to the longitudinal direction.

A VG type memory cell array can be adopted as a modification of the NOR type. In this case, preferably each of the two impurity regions is shared among memory cells adjoining in a direction perpendicular to the longitudinal direction.

Preferably, memory cells adjoining in one direction are isolated by a dielectric isolation layer.

Preferably, the dielectric isolation layer is arranged in stripes parallel to the memory gate electrodes beneath a space between the memory gate electrodes.

Alternately, the dielectric isolation layer is arranged along the memory gate electrodes beneath a space between the memory gate electrodes and separated on the impurity regions.

Further, preferably the memory gate electrode has sidewalls at the two sides in the width direction, and each of the sidewalls is overlapped with an edge of the dielectric isolation layer across the charge storing film in a region adjoining the storage portion.

In a nonvolatile semiconductor memory device of this configuration, there are two storage portions with charge retention faculties. These two storage portions are separated by a single layer dielectric film not having a charge storing capability. Accordingly, when retaining 2 bits of stored data, the 2 bits of stored data are reliably Bet apart. The reason is that even if excessive charges are injected into the storage portions, due to the existence of the single layer dielectric film not having a charge storing capability between them, the charge injection cannot proceed to more than a certain region, so the regions of distribution of the charges will not interact with each other. Further, even if the retained charges drift when holding the device at a high temperature, since the regions of distribution of the charges do not interact, there will be no dilution of the 2 bits of stored data in this respect either.

Further, providing a resistance difference in the channel forming region raises the efficiency of charge injection in a write or erasure operation.

Furthermore, in a nonvolatile semiconductor memory device according to the first aspect of the present invention, when charges are injected into a storage portion, even if a charge leaks out to the part of the charge storing film at the outside of the memory gate electrode in the channel width direction, a leakage path will not easily form between the channel forming region and the impurity regions due to the effect of the charge. This is because the region of the charge storing film to which the charge leaks rides up on the dielectric isolation layer and, as a result, the effect of the leaked charge on the channel forming region is sufficiently reduced. Further, when forming a dielectric isolation layer, if the memory gate electrode is misaligned in its width direction, there will be a region where the controlling force of the memory gate electrode does not reach and the injected charge is not stored in a write operation. For example, when using a system of injecting a charges of the reverse polarity at an erasure operation, sometimes only a charge having a polarity in a direction turning the channel ON ends up being gradually accumulated with each write operation in the region where the controlling force of the memory gate electrode does not extend. This being the case, a situation arises where the threshold voltage in this region falls sharply and the leakage current increases greatly. In the present invention, to prevent a large increase of leakage current, sidewalls are formed at the two sides of the memory gate electrode in the width direction and sufficient overlap with the charge storing film is realized without an area penalty.

Further, the dielectric isolation layer prevents a channel formed beneath the control gate electrode from extending toward another cell sharing the control gate electrode when turning the control gate electrode ON. When there is a dielectric isolation layer, the region under the control gate of a cell of a not selected word line is electrically insulated. For this reason, even if the control gate turns ON, no channel is formed beneath the control gate of a cell of a not selected word line, over depletion results, and the depleted layer spreads due to the heat equilibrium state. In this state, compared with the state where a channel is formed, the gate capacitance will become much smaller. Accordingly, comparing the case where there is no dielectric isolation layer and a channel is formed beneath the control gate electrode in all cells sharing the gate electrode with the case where a channel is formed in the region beneath a control gate electrode in a cell of a selected word line, but there is a dielectric isolation layer and no channel is formed in the region beneath the control gate electrode in other not selected cells, the capacitance of the control gate in the latter case is smaller. The reduction of capacitance of the control gate contributes to higher speed operation and reduced power consumption of a nonvolatile semiconductor memory device.

From the above, this combination of the dielectric isolation layer and memory gate electrode with sidewalls contributes largely to reduction of the leakage current without an increase of cell area and to a reduction of the gate capacitance and increase of the operating speed. Note that when isolating a dielectric isolation layer on an impurity region, no high resistance portion is formed on the impurity region due to the presence of the dielectric isolation layer.

To achieve the first and second objects, according to a second aspect of the present invention, there is provided a method for operating a nonvolatile semiconductor memory device comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film, the operation including a write operation comprising the steps of: applying a predetermined voltage between the two impurity regions so as to make the impurity region located near the storage portion side to be written the drain and to make the other the source; applying a specified voltage to each of the memory gate electrode and the control gate electrode to form a channel between the two impurity regions; and injecting part of the carriers injecting in the channel into the drain side storage portion.

The step of forming the channel preferably comprises controlling the values of voltages applied to the memory gate electrode and the control gate electrode to form a channel having a channel resistance beneath the two storage portions different from a channel resistance beneath the single layer dielectric film between the two impurity regions.

The step of forming the channel alternatively preferably comprises controlling the values of voltages applied to the memory gate electrode and the control gate electrode to generate a high electric field in a channel region beneath the control gate electrode and in a region of the first conductivity type semiconductor beneath a space between the control gate electrode and the memory gate electrode along the direction of charge injection in the channel.

The operation of reading stored data according to a charge retained by high efficiency CHE injection comprises the steps of: applying a voltage between the two impurity regions so as to make the impurity region at the side of the storage portion retaining the stored data to be read the source and to make the other impurity region the drain; applying specified voltages to each of the memory gate electrode and the control gate electrode; and changing the presence or absence of charge or the difference of amount of charge in the storage portion according to the stored data into the amount of current flowing in the channel forming region or the amount of change of voltage of the impurity regions to read the stored data.

In an erasure operation, it is possible to inject hot carriers due to for example a band-to-band tunnel current or inject a reverse conductivity type high energy charge due to avalanche breakdown. That is, the erasure operation comprises the steps of: applying a voltage for inversion of the impurity region between the impurity region located at the side of the storage portion retaining the stored data to be erased and the memory gate electrode; generating a high energy charge of a polarity opposite to the charge injected at the time of the write operation due to avalanche breakdown or a band-to-band tunneling caused at an inversion layer of the impurity region at the time of applying the voltage; and injecting part of the generated high energy charge into the storage portion retaining the stored data.

Alternatively, the retained charges may be extracted from the entire channel surface or from the impurity region side by using the tunnel phenomenon.

To achieve the first and second objects, according to a third aspect of the present invention, there is provided a method for operating a nonvolatile semiconductor memory device comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film, the operation including a write operation comprising the steps of: applying a voltage between the memory gate electrode and the impurity region located at the storage portion side where the data is to be written in a direction so as to invert the impurity region; generating a high energy charge by avalanche breakdown caused in an inversion layer of the impurity region at the time of applying the voltage; and injecting part of the generated high energy charge into the storage portion of the side where data is to be written.

Preferably, the write operation further comprises a step of changing the potential in the channel forming region beneath the single layer dielectric film according to the potential of the control gate electrode to control the injection position of the high energy charge.

By this, for example, it is possible to limit the charge injection region to part of the impurity region side by applying a voltage of the opposite polarity to the gate electrode to the control gate electrode. Alternatively, it is possible to make the charge injection region the entire area of the intended storage portion by applying a voltage of the same polarity as the memory gate electrode to the control gate electrode.

Preferably, an erasure operation of data stored according to the injected charge comprises the steps of: applying a predetermined voltage between the two impurity regions so as to make the impurity region at the side of the storage portion retaining the stored data to be erased the drain and to make the other impurity region the source; applying specified voltages to each of the memory gate electrode and the control gate electrode to form a channel between the two impurity regions; and injecting part of the carriers having an opposite polarity to the charge injected at the time of the write operation and injecting in the channel into the storage portion retaining the stored data to be erased.

The step of forming the channel preferably comprises a step of controlling the values of voltages applied to the memory gate electrode and the control gate electrode to form a channel having a channel resistance beneath the two storage portions different from a channel resistance beneath the single layer dielectric film between the two impurity regions.

In this way, with the method of operating a nonvolatile semiconductor device according to the second or third aspects of the invention, data is written or erased by so-called type CHE charge injection.

At this time, the channel resistance, for example, becomes higher in the inside channel region beneath the control gate electrode and lower in the two outside channel regions. Accordingly, the voltages applied to these three channel regions become values obtained by proportional distribution of the drain voltage applied between the two impurity regions by the equivalent serial resistance values. In this case, the voltage drop becomes highest in the inside channel region. At this portion, the drain voltage is converted efficiently into energy of the carriers injecting in the channel. In particular, when shortening the control gate length, namely the length of the inside channel region, the carriers move quasi-ballistically in the high electric field region, are accelerated almost without any energy loss, and are emitted to the outside channel regions beneath the storage portion. Accordingly, in the present invention, the ratio of the charges, in the high energy charges emitted, which can overcome the energy barrier of the bottom insulating film in the storage portion of the charge storing film increases and therefore the efficiency of charge injection becomes higher than the conventional case where no resistance difference is given in the channel.

Further, in the present invention, because the charge retention region does not extend to more than the size of the storage portion, even if an over-write occurs, the region of distribution of the threshold voltage will not extend much to the write side. Also, since the charge retention region is limited, over erasure will not easily occur.

Further, at the time of over-writing, the charge sneaks around into the charge storing film at the side of the control gate electrode as well, but there is no need to extract the charge held at this side at the time of erasure since it has almost no effect on the channel. Accordingly, even at over-writing, there is no need for lengthening the erasure time by that amount.

A read operation in the method of operating a nonvolatile semiconductor memory device according to the second and third aspects of the invention comprises reading 2 bits of stored data independently by similar read operations switching the source and drain so that the impurity region of the side to be read becomes the source.

According to a fourth aspect of the preset invention, there is provided a method for operation of a nonvolatile semiconductor memory device comprising memory cells arranged in a matrix to form a memory cell array, each of the memory cells comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrode being shared among a plurality of cells in the direction of separation of the impurity regions and comprising a word line; each of the two impurity regions being shared among a plurality of cells in the direction perpendicular to the word line and comprising a bit line; and the control gate electrode being arranged in parallel to the bit line and shared among a plurality of cells in a direction perpendicular to the word line, the method including a read operation comprising a step of applying a voltage of a direction giving a forward bias to the channel forming region to a nonselected word line in a row not including the memory cell to be read.

By application of a voltage in a direction giving a forward bias to the nonselected rows, the potential barrier of the source with respect to the channel becomes higher and an increase in the leakage current due to the so-called DIBL effect is suppressed.

The method of operating a nonvolatile semiconductor memory device according to a fifth aspect of the present invention is for achieving the second object of the present invention and relates to serial operations (write, read, and erasure) of a so-called VG type memory cell array. In a VG type memory cell array, the memory cell array is built by arranging a plurality of memory cells arranged in a matrix. Each memory cell comprises a channel forming region comprised of a first conductivity type semiconductor, two impurity regions comprised of a second conductivity type semiconductor and separated from each other by the channel forming region, a charge storing film including a plurality of stacked dielectric films and having a charge storing capability, two storage portions comprised of regions of the charge storing film overlapping the two ends of the channel forming region at the sides of the two impurity regions, a single layer dielectric film contacting the channel forming region between the storage portions, a memory gate electrode on the storage portions, and a control gate electrode on the single layer dielectric film. The memory gate electrodes in the same row are connected via a word line. Each of the two impurity regions is arranged longwise in the column direction and shared between memory cells adjoining in the row direction. The control gate electrode is arranged long in the column direction and is shared among cells in the same column.

The method for operation comprises the steps of driving the control gate electrode to divide the memory cell array electrically and driving the impurity regions and the word lines to write, read, or erase in parallel a plurality of memory cells in a divided memory cell array.

Preferably, the method comprises the steps of applying at every certain number of control gate electrodes an off voltage for shifting a memory cell to an inactive state where the channel is unable to be turned on; writing, reading, or erasing in parallel memory cells in the active state between memory cells placed in the inactive state due to the division; and repeating the step of dividing the memory cell array and the step of writing, reading, or erasing the memory cells in the active state while shifting the control gate electrodes to which the off voltage is applied in one direction.

In the method of operation according to the fifth aspect of the present investment, the control gate electrode is used as a means for controlling the division of the memory cell array. Namely, when applying an ON voltage to turn the control gate ON, a channel can be formed, while when applying an OFF voltage to turn the control gate OFF, a channel cannot be formed regardless of the presence of application of a drain voltage. If cyclically repeating the OFF state of a control gate for every predetermined number of memory cells in the word line direction, a serial operation becomes possible for active memory cells between the OFF state control gates.

To achieve the third object, according to a sixth aspect of the present invention, there is provided a method for operating a nonvolatile semiconductor memory device comprising a plurality of memory cells arranged in a matrix to form a memory cell array, each of the memory cells comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrodes in the same row being connected by a word line; each of the two impurity regions being arranged longwise in the column direction and shared between memory cells adjoining in the row direction; and the control gate electrode being arranged longwise in the column direction and shared between memory cells in the same column, the method for operation including a write operation comprising the steps of: alternately applying a write drain voltage and a reference voltage to the impurity regions in the memory cell array; applying an ON voltage for shifting a channel from an OFF state to a possible ON state to the control gate electrode in combination according to the data to be written; selecting a storage portion located between the control gate electrode applied with the ON voltage and the impurity region applied with the write drain voltage; applying a specified voltage to a word line of a selected row in which the data is to be written to turn the channel on beneath the selected storage portion and injecting part of the carriers injecting in the channel in the selected storage portion; reapplying the write drain voltage and reference voltage to the impurity regions in the memory cell array while switching the locations of application; reapplying the ON voltage to the control gate electrode in combination according to the data to be written; selecting the remaining storage portion different from above storage portion; and reapplying the voltage to the word line to turn the channel on beneath the selected storage portion and injecting part of the carriers injecting in the channel in the selected storage portion.

When writing data to the entire memory cell array using the method of operation according to the sixth aspect, preferably the method comprises the steps of fixing the potential of the impurity regions and in that state successively selecting the word line to which the memory cell to be written with data is connected and repeating the selection of the storage portion and the injection of carriers into the selected storage portion while changing the application of the ON voltage to the control gate electrode according to the data to be written for each selected word line for all word lines in the memory cell array; reapplying the write drain voltage and reference voltage to the impurity regions in the memory cell array while switching the locations of application; and fixing the potential of the impurity regions and in that state successively selecting the word line to which the memory cell to be written with data is connected and repeating the selection of the storage portion and the injection of carriers into the selected storage portion while changing the application of the ON voltage to the control gate electrode according to the data to be written for each selected word line for all word lines in the memory cell array.

Generally, to operate a cell the fastest, it is necessary to minimize the number of charging and discharging cycles of signal or power supply lines. In particular, it is necessary to minimize the number of time-consuming potential changing cycles for charging and discharging. Here, it is believed the common lines take the most time for charging and discharging since the impurity regions have a high resistance and the RC time-constant determined by the resistance R and capacitance C is large.

In the above method for operating a nonvolatile semiconductor memory device according to the sixth aspect of the present invention, both when writing memory cells in the same row and when writing the entire memory cell array comprised of a plurality of rows, the writing of all memory cells ends while raising and lowering the potentials of impurity regions between the high level and low level once. Therefore, the time for a write operation including a change in potential of signals or power supply lines is short.

To achieve the third object, according to a seventh aspect of the present invention, there is provided a method for operating a nonvolatile semiconductor memory device having memory cells arranged in a matrix to form a memory cell array, each memory cell comprising a channel forming region comprised of a first conductivity type semiconductor, two impurity regions comprised of a second conductivity type semiconductor and separated from each other by the channel forming region, a charge storing film including a plurality of stacked dielectric films and having charge storing capability, two storage portions comprised of regions of the charge storing film overlapping with the two ends of the channel forming region, a single layer dielectric film contacting the channel forming region between the storage portions, a memory gate electrode on the storage portions, and a control gate electrode on the single layer dielectric film, wherein the memory gate electrodes in the same row are connected via a word line, each of the two impurity regions is arranged longwise in the column direction and shared between cells adjoining in the row direction, and the control gate electrode is arranged longwise in the column direction and shared between cells in the same column, comprising reading by a first reading step of reading one storage portion of odd-numbered memory cells in the same row in the memory cell array (hereinafter referred to as a "reading step (1)"), a second reading step of reading the other storage portion of the odd-numbered memory cells included in the same row (hereinafter referred to as a "reading step (2)"), a third reading step of reading one storage portion of even-numbered memory cells in the same row (hereinafter referred to as a "reading step (3)"), and a fourth reading step of reading the other storage portion of the even-numbered memory cells in the same row (hereinafter referred to as a "reading step (4)").

Preferably, the read operation comprises the steps of resetting to apply a reference voltage to all of the impurity regions and apply an OFF voltage to all of the control gate electrodes; selecting the odd-numbered memory cells or the even-numbered memory cells by alternately applying to the control gate electrodes in the memory cell array an ON voltage for shifting a channel from an OFF state to a possible ON state and an OFF voltage for holding the channel in the OFF state; changing the memory cells selected by switching the application of the ON voltage and the OFF voltage; alternatively applying to the impurity regions in the memory cell array the reference voltage and the read drain voltage so as to select a pair of the storage portions on the two sides of an impurity region to which the reference voltage is applied; and changing the pair of storage portions selected by switching the application of the reference voltage and the read drain voltage.

More preferably, a read operation on a plurality of memory cells in the same row comprises the steps of resetting; selecting a pair of storage portions; performing a first reading operation by selecting a memory cell; performing a second reading operation by changing the memory cell selected; resetting; performing a third reading operation by selecting a memory cell; and performing a fourth reading operation by changing the memory cell selected.

When using this method of operation according to the seventh aspect to read the entire memory cell array, a preferable first method fixes the conditions of application of voltage to the impurity regions and the control gate electrodes and repeatedly performs any of the above reading steps (1), (2), (3), and (4) according to the selection of the impurity regions and control gates on all words in the memory cell array. Next, it changes the voltage application conditions of the control gate electrodes (alternately switching them) and then repeatedly performs any of the above reading steps (1), (2), (3), and (4) able to be performed under the conditions fixing the potentials of the control gate electrodes and impurity regions for all of the rows in the memory cell array. Next, the method changes the voltage application conditions of the impurity regions (alternately switching them) and repeatedly performs any of the above reading steps (1), (2), (3), and (4) able to be performed under the conditions fixing the potentials of the control gate electrodes and impurity regions for all rows in the memory cell array. Next, it changes the voltage application conditions of the control gate electrodes (alternately switching them) and then repeatedly performs any of the above reading steps (1), (2), (3), and (4) able to be performed under the conditions fixing the potentials of the control gate electrodes and impurity regions for all of the rows in the memory cell array.

In this first method, the order of the switching of application of voltage to the impurity regions and the switching of the application of voltage to the control gate electrodes may be reversed. Namely, a preferable second method fixes the conditions of application of voltage to the impurity regions and the control gate electrodes, then repeatedly performs any of the above reading steps (1), (2), (3), and (4) according to the selection of the impurity regions and control gates on all rows in the memory cell array. Next, it changes the voltage application condition of the impurity regions (alternately switching them) and then repeatedly performs any of the above reading steps (1), (2), (3), and (4) able to be performed under the conditions fixing the potentials of the impurity regions and control gate electrodes for all of the rows in the memory cell array.

Next, the method changes the voltage application conditions of the impurity regions (alternately switching them) and repeatedly performs any of the above reading steps (1), (2), (3), and (4) able to be performed under the conditions fixing the potentials of the control gate electrodes and impurity regions for all rows in the memory cell array. Next, it changes the voltage application conditions of the control gate electrodes (alternately switching them) and then repeatedly performs any of the above reading steps (1), (2), (3), and (4) able to be performed under the conditions fixing the potentials of the control gate electrodes and impurity regions for all of the rows in the memory cell array. Next, it changes the voltage application condition of the impurity regions (alternately switching them) and then repeatedly performs any of the above reading steps (1), (2), (3), and (4) able to be performed under the conditions fixing the potentials of the impurity regions and control gate electrodes for all of the rows in the memory cell array.

In the above method for operation of a nonvolatile semiconductor memory device according to the seventh aspect of the present invention, both when reading memory cells in the same row and when reading the entire memory cell array comprised of a plurality of rows, the reading of all memory cells ends while raising and lowering the potentials of impurity regions between the high level and low level once. Therefore, the time for a read operation including a change in potential of signals or power supply lines is short.

To achieve the first and second object, according to an eighth aspect of the present invention, there is provided a method for producing a nonvolatile semiconductor memory device including a memory cell comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping the two ends of the channel forming region at the two impurity region sides, a single layer dielectric film contacting the channel forming region between the storage portions, a memory gate electrode on the storage portions, and a control gate electrode on the single layer dielectric film, the method comprising the steps of forming on the first conductivity type semiconductor a pattern of the single layer dielectric film and the control gate electrode on the dielectric film; forming the charge storing film covering the surface of the pattern and the surface of the first conductivity type semiconductor; forming sidewalls comprised of a conductive material facing the side faces of the pattern across the charge storing film on the portion of the charge storing film forming the storage portion; doping a second conductivity type impurity into the first conductivity type semiconductor outside the sidewalls using the sidewalls and the pattern as masks to form the two impurity regions having a second conductivity type; and forming a conductive film for forming the memory gate electrode together with the sidewalls and processing the conductive film to form the memory gate electrode.

Preferably, the method comprises the steps of doping an impurity for defining the threshold voltage of a part of the channel forming region beneath the control gate electrode into an entire surface region of the first conductivity type semiconductor; forming the pattern; and adding the impurity to a part of the channel forming region around the pattern to adjust the threshold voltage thereof.

In this method, just by adding to a conventional method of manufacture of the memory cell able to store 2 bits a step of forming a stacked pattern of a single layer dielectric film not having a charge storing capability and a control gate electrode, a memory cell having various beneficial effects as mentioned above can be produced.

BRIEF DESCRIPTION OF THE DRAWINGS

These and other objects and features of the present invention will be become clearer from the following description of the referred embodiments given with reference to the accompanying drawings, in which:

FIG. 5A to FIG. 5D are sectional views of a memory cell according to the first embodiment of the present invention, in which FIG. 5A shows the state after formation of a control gate electrode, FIG. 5B the state at the time of counter doping, FIG. 5C the state after formation of a sidewall, and FIG. 5D the state after formation of a memory gate electrode;

FIG. 9A to FIG. 9C are sectional views of a memory cell according to the second embodiment of the present invention, in which FIG. 2A is a sectional view along the line A—A of FIG. 8, FIG. 2B is a sectional view along the line B—B of FIG. 8, and FIG. 2C is a sectional view along the line C—C of FIG. 8;

FIG. 10A to FIG. 10D are sectional views of a memory cell according to the second embodiment of the present invention, in which FIG. 10A shows the state after formation of the pattern of the control gate electrode, FIG. 10B the state at the time of counter doping, FIG. 10C the state after formation of a sidewall, and FIG. 10D the state after formation of a memory gate electrode;

FIG. 12A to FIG. 12D are sectional views of a memory cell according to the third embodiment of the present invention, in which FIG. 12A shows the state after formation of the pattern of the control gate electrode, FIG. 12B the state at the time of counter doping, FIG. 12C-1 the state after formation of S/D impurity regions, FIG. 12C-2 the state after formation of a charge storing film, and FIG. 12D the state after formation of a memory gate electrode;

FIG. 20 is a circuit diagram showing the voltage application conditions in a first serial read operation of a separated source line NOR type memory array according to a fifth embodiment of the present invention; and FIG. 21 is a circuit diagram showing the voltage application conditions in a first serial read operation of a VG type cell array according to a fifth embodiment of the present invention.

DESCRIPTION OF THE PREFERRED EMBODIMENTS

Below, preferred embodiments will be described with reference to the accompanying drawings taking as an example a nonvolatile semiconductor memory device having an n-channel MONOS type memory transistor. Note that, in a case of a p-channel type, the following description can be applied similarly by reversing the conductivity types of impurities in the semiconductors and the polarities of the carriers and voltage application conditions.

First Embodiment

Figure 1A:
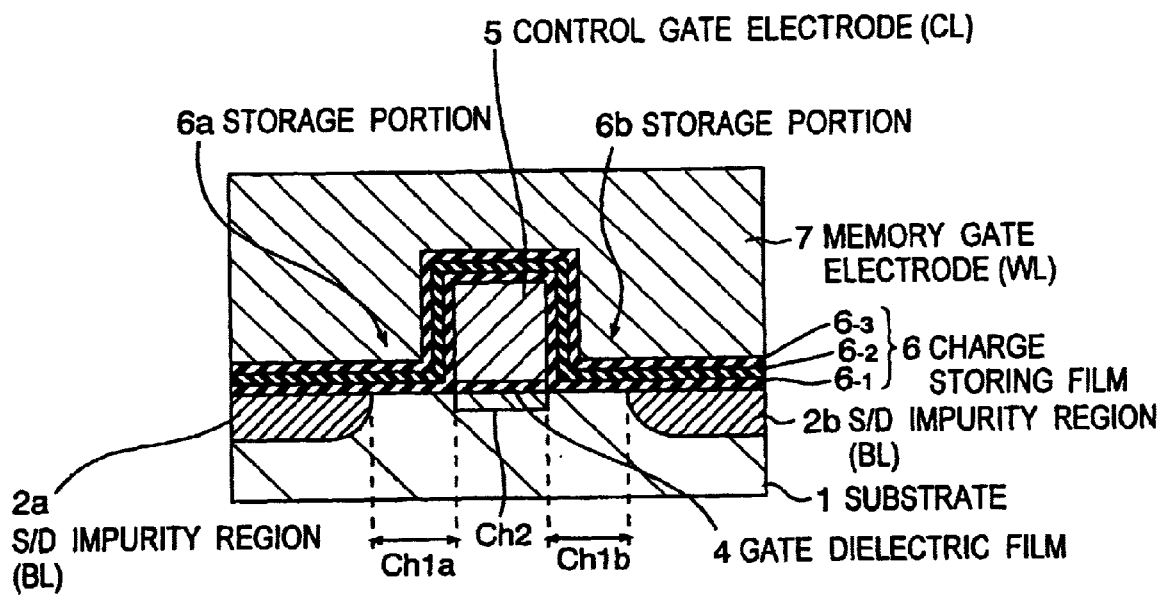
FIG. 1A and FIG. 1B are sectional and plan views of a memory cell according to the first embodiment.
Figure 1B:
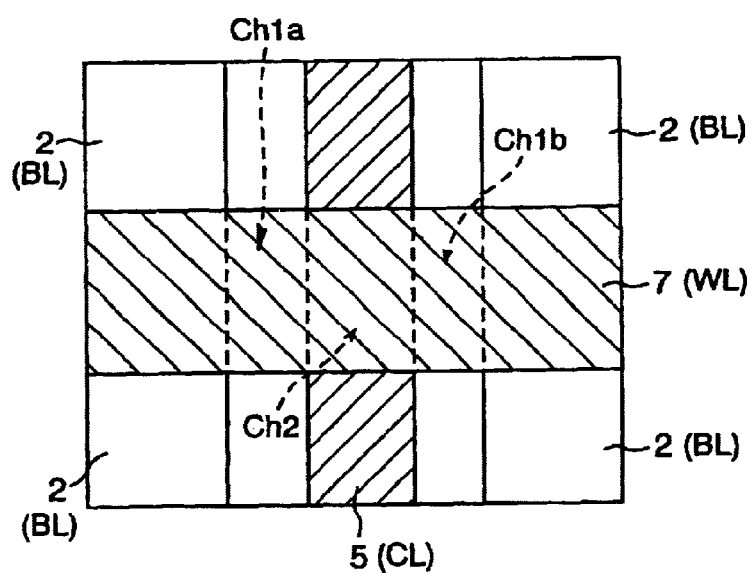
Figure 2:
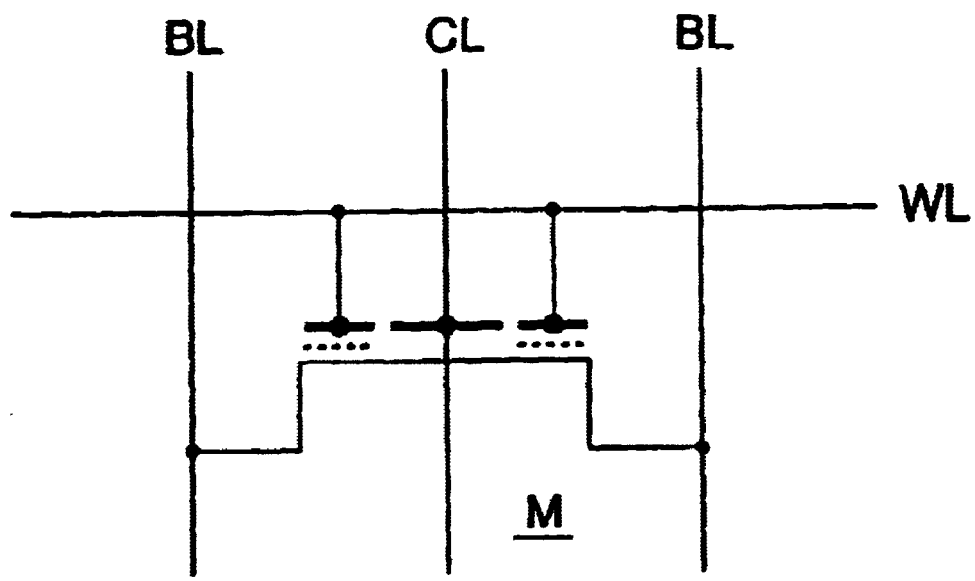
FIG. 2 is a equivalent circuit diagram of a memory cell according to first to fifth embodiments of the present invention.

FIG. 1A is a sectional view of the structure of a memory cell according to the first embodiment, while FIG. 1B is a plan view thereof. Further, FIG. 2 is an equivalent circuit diagram of this memory cell.

In the memory cell shown in FIG. 1A, reference numeral 1 indicates a substrate comprised of a semiconductor material of for example silicon and in which a semiconductor element is formed (for example, a p-type semiconductor substrate, a p-well, or p-type SOI layer, hereinafter referred to as a substrate).

In the surface region of the substrate 1, two impurity regions made by doping n-type impurities at a high concentration (source or drain (S/D) regions) are formed at a distance from each other.

The S/D impurity regions 2, as shown in FIG. 1B, are arranged longwise in one direction and parallel with each other. The surface region of the substrate between the two S/D impurity regions forms a channel forming region in which a channel of the memory transistor is formed at the time of operation. The channel forming region is comprised of an inside channel region Ch2 formed at substantially the center thereof and two outside channel regions Ch1$a$ and Ch1$b$ between the inside channel region Ch2 and the S/D impurity regions 2. In the inside channel region Ch2, the concentration of the activated p-type impurity is higher than the outside channel impurity regions Ch1$a$ and Ch1$b$ and the threshold voltage is made higher.

A single layer gate dielectric film 4 comprised of silicon dioxide of a thickness of for example 1 nm to 10 nm is formed on the inside channel region Ch2. This gate dielectric film 4 is made of a single layer and has a relatively small number of carrier traps and does not have a charge storing capability.

On the gate dielectric film 4, a control gate electrode 5 comprised of for example polycrystalline silicon or amorphous silicon doped with an impurity is formed. The control gate electrode 5, as shown in FIG. 1B, is arranged longwise in a direction parallel to the S/D impurity regions 2 inside in the space separating the S/D impurity regions 2. The control gate 5 comprises a control line CL of the memory cell array as will be explained later on. The length of the control gate electrode 5 is not limited, but if made superfine, for example 50 nm, the carriers in the channel run quasi-ballistically. Namely, while depending on the electric field conditions, if the gate length is made superfine, when the carriers supplied from the source move in the channel, while undergoing small-angle scattering due to the impurity, the carriers run ballistically without large-angle scattering causing large bending of their trajectories.

A dielectric film (charge storing film) 6, comprised of a plurality of insulating films and having a charge storing capability is formed to cover the surface of a stacked pattern of the gate dielectric film 4 and the control gate electrode 5 and the substrate surface.

The charge storing film 6 is configured, in order from the bottom, by a bottom dielectric film $6_{-1}$, a dielectric film mainly for storing a charge (main charge storing film) $6_{-2}$, and a top dielectric film $6_{-3}$.

As the bottom dielectric film $6_{-1}$, for example, a silicon dioxide film formed by thermal oxidation, a film formed by nitridation of a silicon dioxide film, etc. is utilized. The thickness of the bottom dielectric film $6_{-1}$ is for example in a range of 2.5 nm to 6.0 nm.

The main charge storing film $6_{-2}$ is comprised of a silicon nitride film with a thickness of for example 3.5 nm to 6.0 nm. The main charge storing film $6_{-2}$ is formed by for example low pressure CVD (LP-CVD) and includes a large number of carrier traps in the film.

As for the top dielectric film $6_{-3}$, it is necessary to form deep carrier traps at a high density near the border with the main charge storing film $6_{-2}$. For this purpose, for example it is formed by thermal oxidation of a formed main charge storing film $6_{-2}$. Also, the top dielectric film $6_{-3}$ may be a high temperature chemical vapor deposited oxide (HTO) film. When the top dielectric film $6_{-3}$ is formed by CVD, the traps are formed by heat treatment. The thickness of the top dielectric film $6_{-3}$ is required to be at least 3.0 nm, preferably not less than 3.3 nm, for effectively blocking injection of holes from the gate electrode (word line WL) and preventing a decrease of the data rewrites.

On the charge storing film 6, a gate electrode 7 of a memory transistor (hereinafter referred to as a memory gate electrode) is formed intersecting the control gate electrode 5. The memory gate electrode 7 is comprised of for example polycrystalline silicon or amorphous silicon doped with an impurity and, as will be explained later on, comprises a word line WL of the memory cell array.

The memory cell M constructed as such is configured by three transistors, that is, a memory transistor, a MOS type transistor, and another memory transistor serially connected between two bit lines BL. Gates of the two memory transistors are controlled by the word line WL, while a gate of the center MOS type transistor is controlled by a control line CL parallel with a bit line BL.

A threshold voltage of the memory transistor in the erased state is set lower than the threshold voltage of the MOS type transistor by various conditions such as the difference of channel concentration and materials, thickness, and structure of the dielectric films 4 and 6.

The center MOS type transistor functions mainly to assist the operation of the memory transistors (write, read, or erasure) for improvement of the characteristics or to define a portion of contact between the substrate 1 and the charge storing film 6. The portion of the charge storing film 6 contacting the substrate 1, called a "storage portion", is a portion in which charge is injected and held in. The single layer dielectric film between the two storage portions 6$a$ and 6$b$ (gate dielectric film 4) cannot contribute to data storage since it does not have charge storing capability. Note that this transistor operation will be explained in detail later on.

Figure 3:
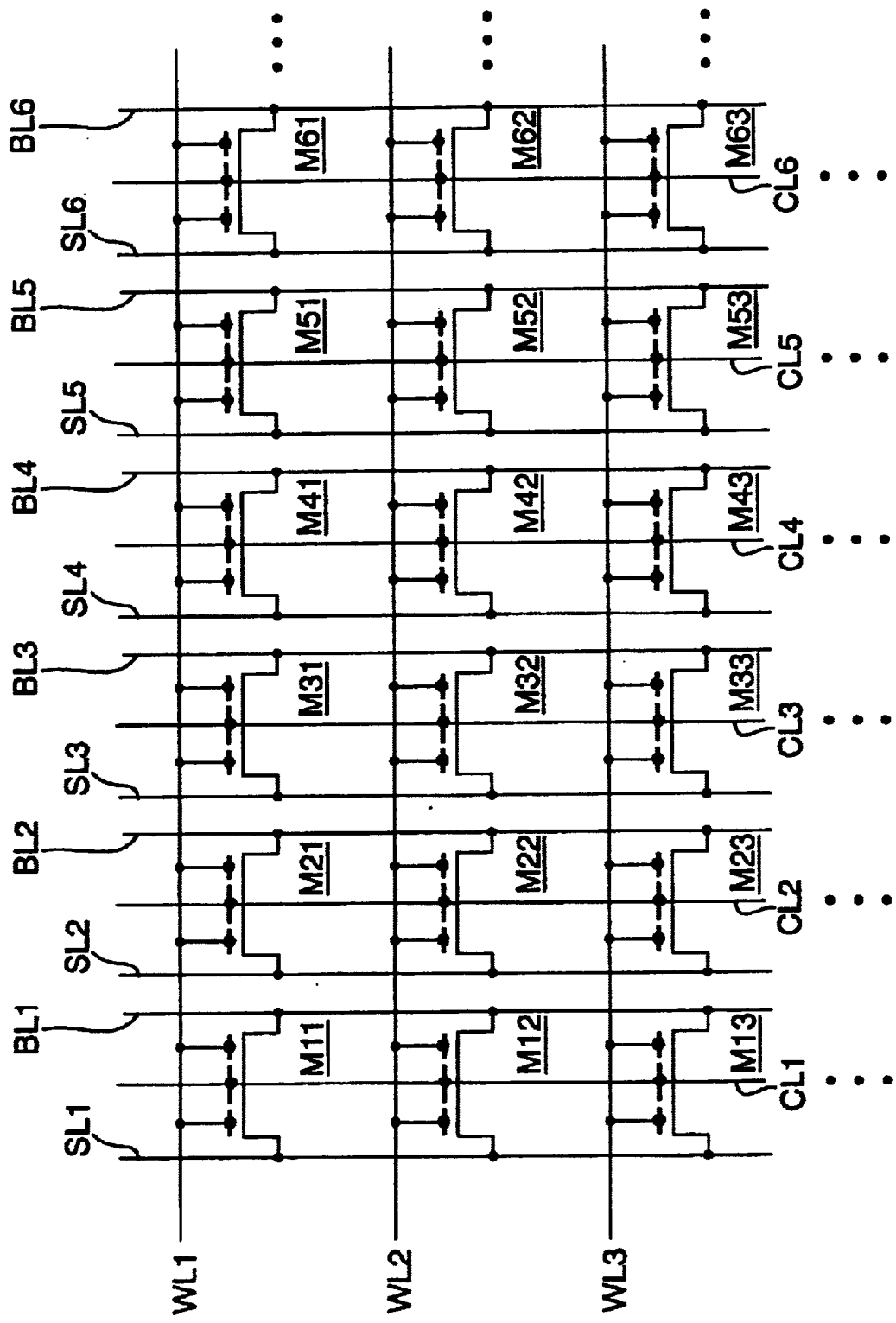
FIG. 3 is a circuit diagram of a so-called separated source line NOR type memory cell array among the memory cell arrays according to the first to fifth embodiments of the present invention.
Figure 4:
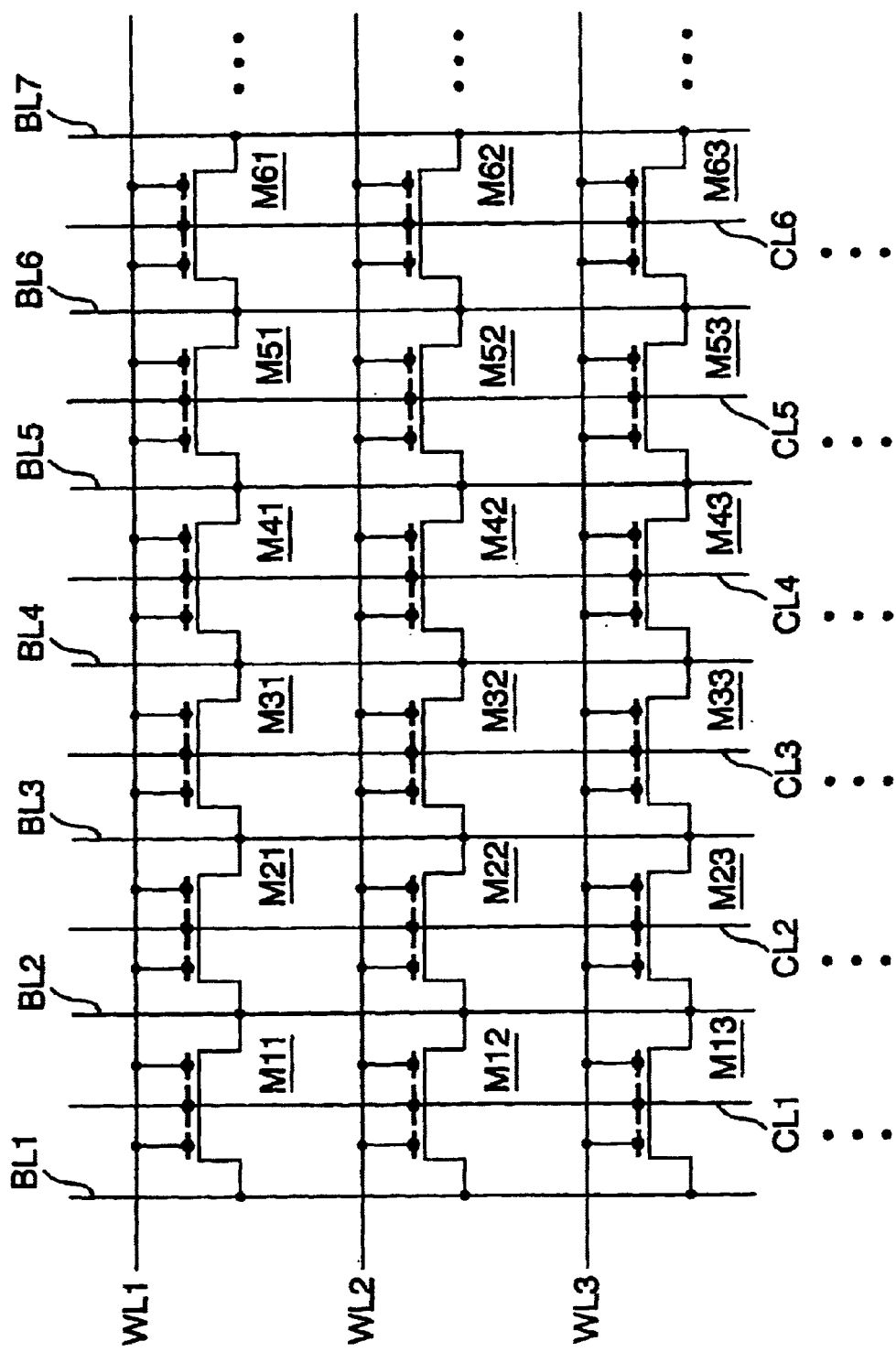
FIG. 4 is a circuit diagram of a so-called VG type memory cell array among the memory cell arrays according to the first to fifth embodiments of the present invention.

FIG. 3 and FIG. 4 show two representative examples of the configuration of a memory cell array. Note that FIG. 3 and FIG. 4 show part of a memory cell array comprised of 6 ×3 memory cells.

FIG. 3 shows a NOR type memory cell array with S/D impurity regions separated in the row direction. This NOR type memory cell array includes source and bit lines arranged hierarchically and blocks, comprised of predetermined numbers of memory cells connected in parallel between sub source lines and sub bit lines comprised of impurity regions, further connected in parallel to higher layer main source lines and main bit lines. Further, though the functions of the source lines SL and bit lines BL are shown by their names in FIG. 3, these functions are not fixed in a MONOS type memory cell able to store 2 bits per cell. Namely, the functions of the source lines SL and bit lines BL are switched according to which bit of the two is to be written or to be read.

Specifically, for example, source lines SL1, SL2, . . . , SL6, . . . comprised of odd-numbered S/D impurity regions 2 and bit lines BL1, BL2, . . . , BL6, . . . comprised of even-number S/D impurity regions are arranged alternately in the row direction and longwise and parallel in the column direction. Normally, common lines SLi and BLi (i=1, 2, . . . ) comprised of these impurity regions are suitably connected for each predetermined numbers to upper metal interconnections and made hierarchical in order to reduce the interconnection resistance.

Figure 12A:
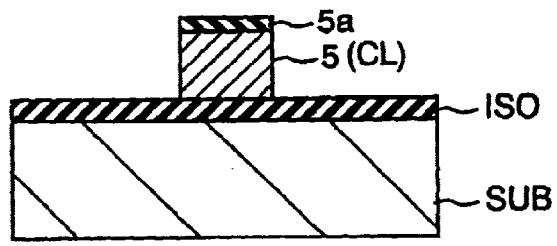
Figure 12B:
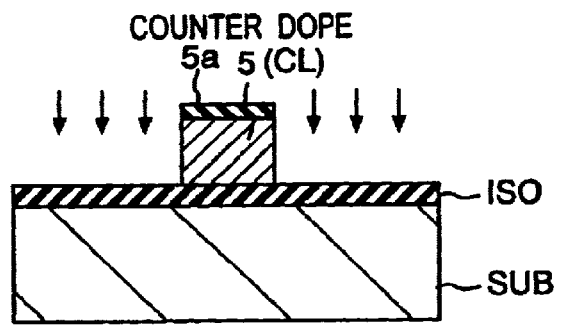
Figures 1, 12C:
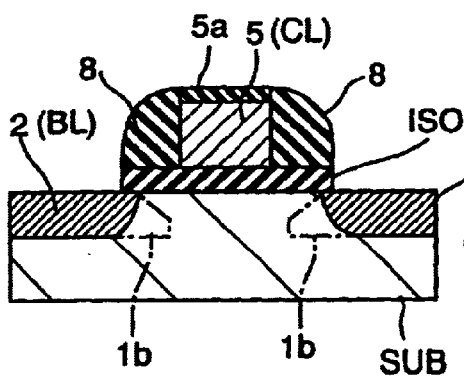
Figures 2, 12C:
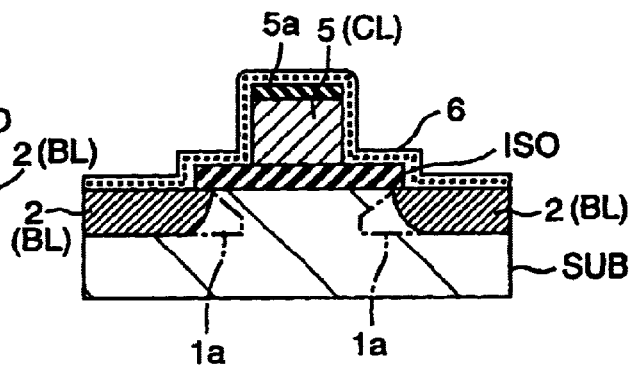

Further, word lines WLi comprised of the memory gate electrodes 7 of FIG. 1 are arranged longwise and in parallel in the row direction. Memory cells with connections shown as FIG. 2 are arranged near intersections of the pairs of the source lines SLi and the bit line BLi and the word lines WLi.

In the first row, for example, memory cells M11, M12, M13, . . . , are connected in parallel between the source line SL1 and the bit line BLi, two memory gate electrodes 7 of the memory cell M11 are connected to the word line WL1, two memory gate electrodes 7 of the memory cell M12 are connected to the word line WL2, and two memory gate electrodes 7 of the memory cell M13 are connected to the word line WL3. This connection is repeated for other rows as well. Control lines CL1, CL2, CL3, . . . comprised of the control gate electrodes 5 are arranged in the row direction injecting through the substantial centers of the rows of memory cells.

Circuits for controlling these common lines are not illustrated. The source lines SL and bit lines BL are controlled by a column decoder, the word lines WL are controlled by a row decoder, and the control lines CL are controlled by a column division control circuit.

FIG. 4 shows a so-called VG type memory cell array which is a sort of NOR type.

In the memory cell array shown in FIG. 4, the bit lines BLi and source lines SLi+1 adjoining each other in FIG. 3 are shared by a single interconnection. Specifically, the interconnections in the column direction are comprised of the bit lines BL1, BL2, . . . BL7, . . . also serving as source lines and the control lines CL1, CL2, . . . , CL6, . . . arranged alternately in the row direction. The rest of the configuration is the same as in FIG. 3.

In such a VG type memory cell array, in comparison with FIG. 3, space for arrangement of one S/D impurity region becomes unnecessary and there is more room for upper metal interconnections, so the cell area becomes small.

Next, the method of manufacture of the memory cell of the configuration of FIG. 1 will be explained using FIG. 5A to FIG. 5D.

Figure 5A:
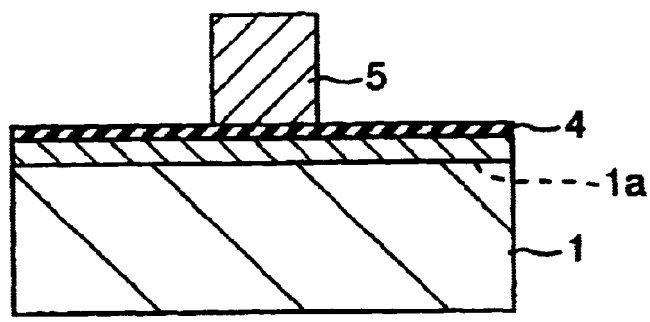

First, a p-well or SOI layer is formed as needed on the prepared silicon wafer etc. The surface of the semiconductor (substrate 1) formed in this way and on which transistors are to be formed is for example thermally oxidized to form a gate dielectric film 4. The entire surface of the substrate 1 is channel doped for determining the relatively high threshold voltage of the center MOS type transistor by ion implantation for example using the gate dielectric film 4 as a through film. Due to this, as shown in FIG. 5A, a high threshold channel doped layer 1a for forming the inside channel region Ch2 mentioned above is formed at the surface region of the substrate 1.

Next, an impurity-doped polycrystalline silicon or amorphous silicon is deposited on the gate dielectric film 4, then is patterned into a long line in the column direction to form the control gate electrode 5.

Figure 5B:
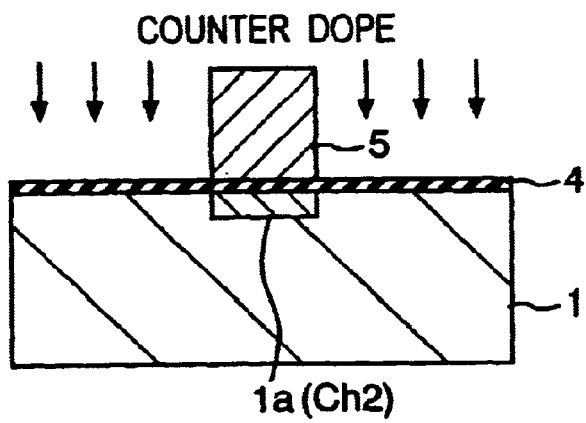

As shown in FIG. 5B, by ion implantation using the control gate electrode 5 as a mask and the gate dielectric film 4 as a through film, a reverse conductivity type impurity is introduced into the surface region of the substrate 1 surrounding the control gate electrode 5, (counter doping). Due to this, in the surface region of the substrate 1 surrounding the control gate electrode 5, the p-type conductivity is weakened more than the region beneath the control gate electrode 5. As a result, the threshold voltages of the outside channel regions Ch1$a$ and Ch1$b$ fall in comparison with the inside channel region Ch2 in FIG. 1. Due to this, it is possible to obtain a lower channel resistance even when the same voltage is applied.

Figure 5C:
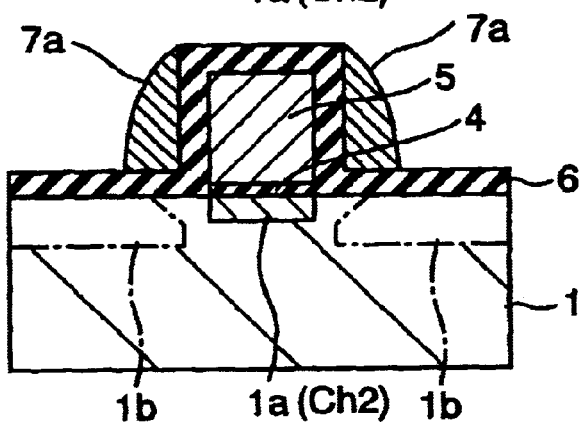
Figure 5D:
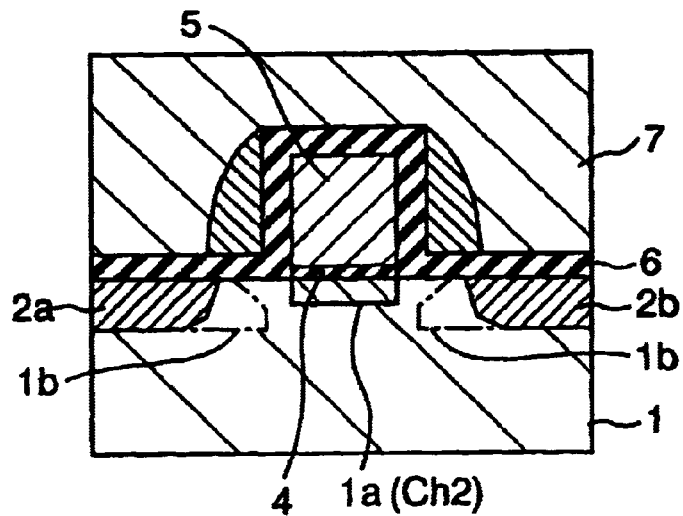

Next, as shown in FIG. 5C, the gate dielectric film 4 is processed to the same pattern using the control gate electrode 5, then a charge storing film 6 is formed on the surface of the stacked pattern of this gate dielectric film 4 and the control gate electrode 5 and the surface of the substrate.

Specifically, for example, heat treatment is performed by a rapid thermal oxidation (RTO) at 1000° C. and 10 sec to form a silicon dioxide film (bottom dielectric film $6_{-1}$).

Next, a silicon nitride film (main charge storing film $6_{-2}$) is formed on the bottom dielectric film $6_{-1}$ by LP-CVD to a slightly larger thickness so as to give a final thickness of 6 nm. This CVD, for example, is performed using a mixed gas of dichlorosilane (DCS) and ammonia and a substrate temperature of 730° C.

The surface of the formed silicon nitride film is then oxidized by thermal oxidation to form a silicon dioxide film (top dielectric film $6_{-3}$) to a thickness of for example 3.5 nm. This thermal oxidation is performed, for example, in an H20 atmosphere at a furnace temperature of 950° C. for 40 minutes. Due to this, deep carrier traps with a trap level (energy difference from the conduction band of the silicon nitride film) less than 2.0 eV or so are formed at a concentration of about $1\times10^{11}$ to $1\times10^{13}/cm^2$. A silicon dioxide film (top dielectric film $6_{-3}$) is formed to a thickness of 1.5 nm for each reduction of 1 nm of the thickness of main charge storing film $6_{-2}$. The thickness of the underlying main charge storing film $6_{-3}$ is reduced by this ratio and the final thickness of the main charge storing film $6_{-2}$ becomes 6 nm.

Next, sidewalls 7$a$ comprised of a conductive material are formed at the two side faces of a step of the charge storing film 6 formed reflecting the shape of the control gate electrode 5. Specifically, an impurity-doped polycrystalline silicon or amorphous silicon is deposited thickly and then etched backed over its entire surface under strongly anisotropic conditions.

According to need, ions are implanted at a slant using the formed sidewalls 7$a$ and the control gate 5 as a mask so as to dope the n-type or p-type impurity 1b relatively deep in the substrate 1. By this doping of an n-type or p-type impurity 1b in the region below the sidewalls 7a, it becomes possible to adjust the threshold voltage or improve the punch through endurance.

Next, ions are implanted substantially vertically using the sidewalls 7a and the control gate electrode 5 as a mask so as to dope an n-type impurity to regions inside the substrate outside the sidewalls 7a and form the S/D impurity regions 2.

Then, for example, polycrystalline silicon or amorphous silicon doped with impurities under the same conditions as the material of the sidewalls 7a is deposited thickly on the entire surface, then is patterned into a line longwise in the direction perpendicular to the control gate electrode 5 to form the memory gate electrode 7 (word line WL). Here, at the end point of this etching, the underlying charge storing film 6 is exposed at the two sides of the memory gate electrode 7 in the width direction in FIG. 1B. According to need, it is also possible to intentionally over etch to reduce the charge storing capability of this part of the charge storing film. Note that in the memory cell structure of the present embodiment, there is little generation of residue of polycrystalline silicon or amorphous silicon at the outskirts of the step due to the control gate electrode 5 even if not over etching much. This is due to the etching using as a mask the resist pattern left in a line shape in the patterning of the control gate electrode 5. Even if the anisotropy of etching is made stronger, usually the pattern after formation of the control gate electrode 5 reflects the sectional shape of the resist and becomes a forward taper to some extent.

Next, as needed, an interlayer insulating layer is deposited, contacts are formed, and the upper interconnection layer is formed to complete this nonvolatile semiconductor memory device.

In this method of production, in comparison to the conventional method of producing a cell having no control gate electrode 5, there are the additional steps of forming and patterning the films for forming the gate dielectric film 4 and control gate electrode 5. Further, when providing a resistance difference in the channel, ion injection is necessary for counter doping. These steps are minor compared with the overall manufacturing process of a nonvolatile semiconductor memory device and do not cause a major increase in costs.

Furthermore, the structure is very simple and easily formed.

Next, the operations of the memory cell will be explained.

Figures 6A, 6B:
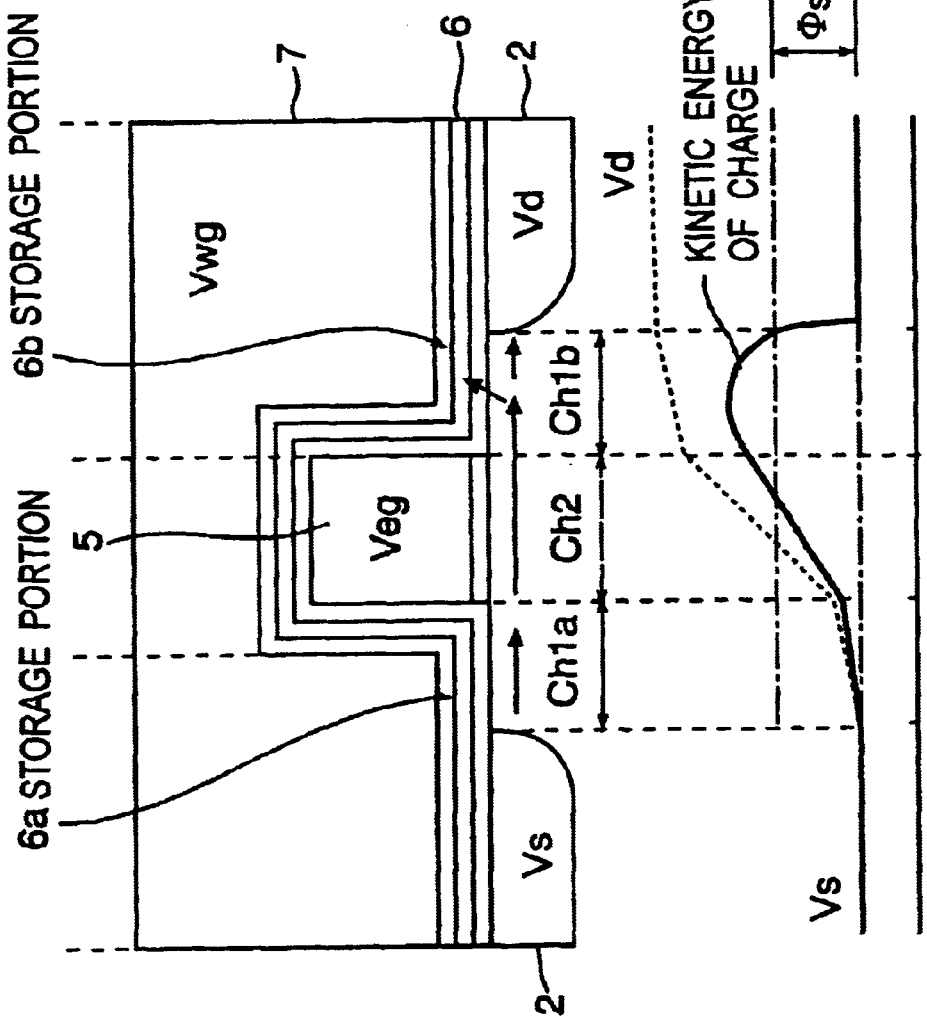
FIG. 6 is a view of a first method using CHE injection as a write method according to the first to fifth embodiments of the present invention.
Figure 7:
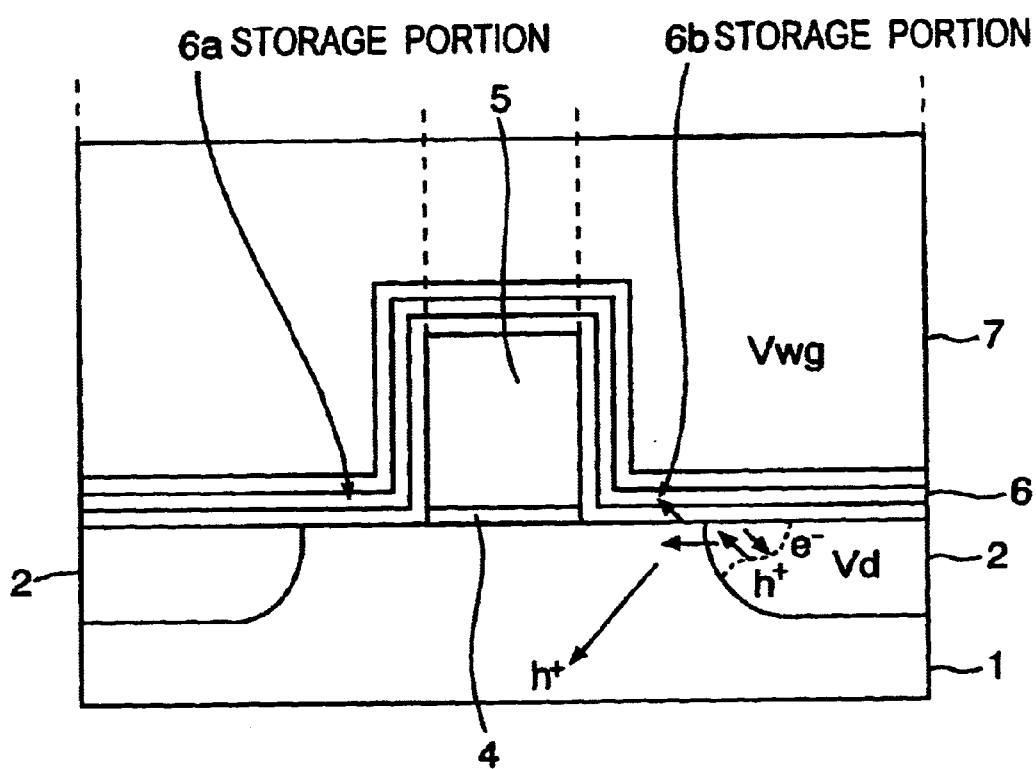
FIG. 7 is a view of a second method using injection of high energy charges by avalanche breakdown as a write method according to the first to fifth embodiments of the present invention.

For a write operation, there is the first method using CHE injection and the second method using injection of high energy charges generated by avalanche breakdown. The principle of the write operation of the first method is shown in FIG. 6A and FIG. 6B, while the principle of the write operation of the second method is shown in FIG. 7.

In the first method, a reference voltage Vs is applied to the impurity region 2 becoming the source, a drain voltage Vd is applied to the other impurity region 2 becoming the drain, a predetermined positive voltage Vcg is applied to the control gate electrode 5 (control line CL), and another predetermined positive voltage Vwg is applied to the memory gate electrode 7 (word line WL).

Under these conditions, an inversion layer (channel) is formed in the channel forming region, electrons supplied from the source are accelerated in the channel, part of which become a high energy charge (hot electrons) overcoming the energy barrier $\phi_{SiO2}$ of the silicon dioxide film comprising the bottom dielectric film $6_{-1}$ of the charge storing film 6. Part of the hot electrons are injected in the drain side portion of the charge storing film 6 (storage portion 6b) at a certain probability.

To raise the injection efficiency of the hot electrons in the channel, the voltages applied to the control gate electrode 5 and the memory gate electrode 7 are controlled to generate a high electric field along the channel direction in the first conductivity type semiconductor region beneath the control gate electrode 5. Due to this, it is possible to create a distribution of the electric field similar to that of source side injection known in the field of flash memories-near the injection region and possible to improve the injection efficiency by for example three orders of magnitude.

The electrons in the channel are accelerated as a whole while losing some of the energy obtained from the electric field due to impurity scattering or collision with the semiconductor lattice. The broken line in FIG. 6B indicates the energy when all of the potential energy is converted into kinetic energy or the energy obtained when assuming that the electrons are accelerated by an electric field in a vacuum. The actual kinetic energy of electrons, as shown by the solid line, peaks near the drain end while increasing in energy loss the greater the acceleration. When entering the n-type impurity region 2b filled with electrons, the kinetic energy rapidly falls. If making the peak point of kinetic energy as large as possible, the injection efficiency of the hot electrons will improve.

In the present embodiment, by giving a resistance difference to the channel, the resistance of the inside channel region Ch2 is relatively increased, the electric field in that region is increased, and the acceleration efficiency there is improved. Accordingly, the electrons are excited energy-wise most efficiently just before injection. As a result, the efficiency of hot electron injection is improved more than the conventional case where no resistance difference is given in the channel. In particular, when shortening the inside channel length, the electrons run quasi-ballistically in the high energy electric field and the efficiency of injection is improved more. Further, source side injection is possible by channel control using the control gate electrode 5 even without giving a resistance difference in the channel. Therefore, the injection efficiency is improved over the past.

On the other hand, when desiring to write in the other storage portion 6a, the relative voltages of the two impurity regions 2 are switched so that hot electrons are injected in the storage portion 6a by a similar principle. If electrons are injected, the threshold voltage of the memory transistor rises and the write state is achieved.

In this way, 2 bits of stored data are written independently in one memory cell.

In the second write method, as shown in FIG. 7, a negative voltage Vwg is applied to the memory gate electrode 7 (word line WL) and a positive voltage Vd is applied to the write side impurity region 2.

Under these condition, the surface of the n-type impurity region becomes deeply depleted and the energy band bends sharply. Then, an inversion layer is formed and avalanche breakdown occurs. Electron and hole pairs having a high energy are generated in the process up to avalanche breakdown. High energy electrons are pulled by the positive voltage Vd and absorbed in the n-type impurity region 2. On the other hand, while most of the high energy holes (hot holes) flow to the substrate 1, part also drift to the channel forming region side, then are pulled by the electric field of the memory gate electrode 7 and overcome the silicon dioxide film barrier $\phi_{SiO2}$ to be injected into the charge storing film 6.

In the second method, hot holes can be similarly injected into the opposite side storage portion 6a. This method enables simultaneous writing to the two storage portions 6a and 6b since no channel is formed.

The read operation uses so-called reverse reading. That is, a drain voltage of for example 1.5V to 3.0V is applied between the two S/D impurity regions 2 so that the storage portion side storing the data to be read becomes the source and the other storage portion side becomes the drain, and predetermined positive voltages are applied to the two gate electrodes 5 and 7. As a result, the channel turns on or off or differences arise in the amount of current according to the presence of a charge in the storage portion to be read or the difference in the amount of charge. As a result, changes in potential arise in the drain side impurity region. By reading the change in potential by a not shown sense amplifier, the logic of the stored data can be discriminated.

The other storage portion is read in the same way by switching the source and drain. Due to this, 2 bits of stored data can be read independently.

In an erasure operation, the stored charge is either extracted or a charge of the opposite polarity is injected. In the latter case, when the data was written by the above first method, the second method is utilized for its erasure. Contrary to this, when the data was written by the second method, the first method is utilized for its erasure. For erasure, it is also possible to use a third method of injecting a high energy charge due to the band-to-band tunnel effect. In this method, a voltage which enables the surface of an impurity region 2 to invert is applied between the memory gate electrode 7 and an impurity region 2 and a voltage which gives a reverse bias to the p-n junction between the impurity region 2 and the substrate 1 is applied. The band bends sharply by this reverse bias voltage. Electron-hole pairs are generated due to the band-to-band tunnel current. Among these, charges of a polarity opposite to the retained charge (for example holes) are accelerated by the electric field applied between the memory gate electrode 7 and the impurity region 2, obtain high energy, and are injected into the storage portion 6a or 6b.

Note that for extracting the stored charge of the former method, a predetermined electric field of a magnitude and a direction for extracting a charge by the tunneling phenomenon is generated between the memory gate electrode 7 and the impurity region 2 (and the substrate 1). Due to this, the stored charge is extracted to the substrate side, the threshold voltage of the memory transistor becomes low, and the erasure state is achieved.

According to the nonvolatile memory according to the first embodiment explained above, there are two storage portions 6a and 6b with charge retention faculties. These two storage portions 6a and 6b are separated by a single layer dielectric film 4 not having a charge storing capability. Accordingly, when retaining 2 bits of stored data, the 2 bits of stored data are reliably set apart. The reason is that even if excessive charges are injected into the storage portions 6a and 6b, due to the existence of the single layer dielectric film 4 not having a charge storing capability between them, the charge injection cannot proceed to more than a certain area, so the regions of distribution of the charges will not interact with each other. Further, even if the retained charges drift when holding the device at a high temperature, since the regions of distribution of the charges do not interact, there will be no dilution of the 2 bits of stored data in this respect either.

Further, providing a resistance difference in the channel forming region Ch raises the efficiency of charge injection in a write or erasure operation and realizes high speed operation.

Second Embodiment

The second embodiment relates to a first dielectric isolation structure.

Figure 8:
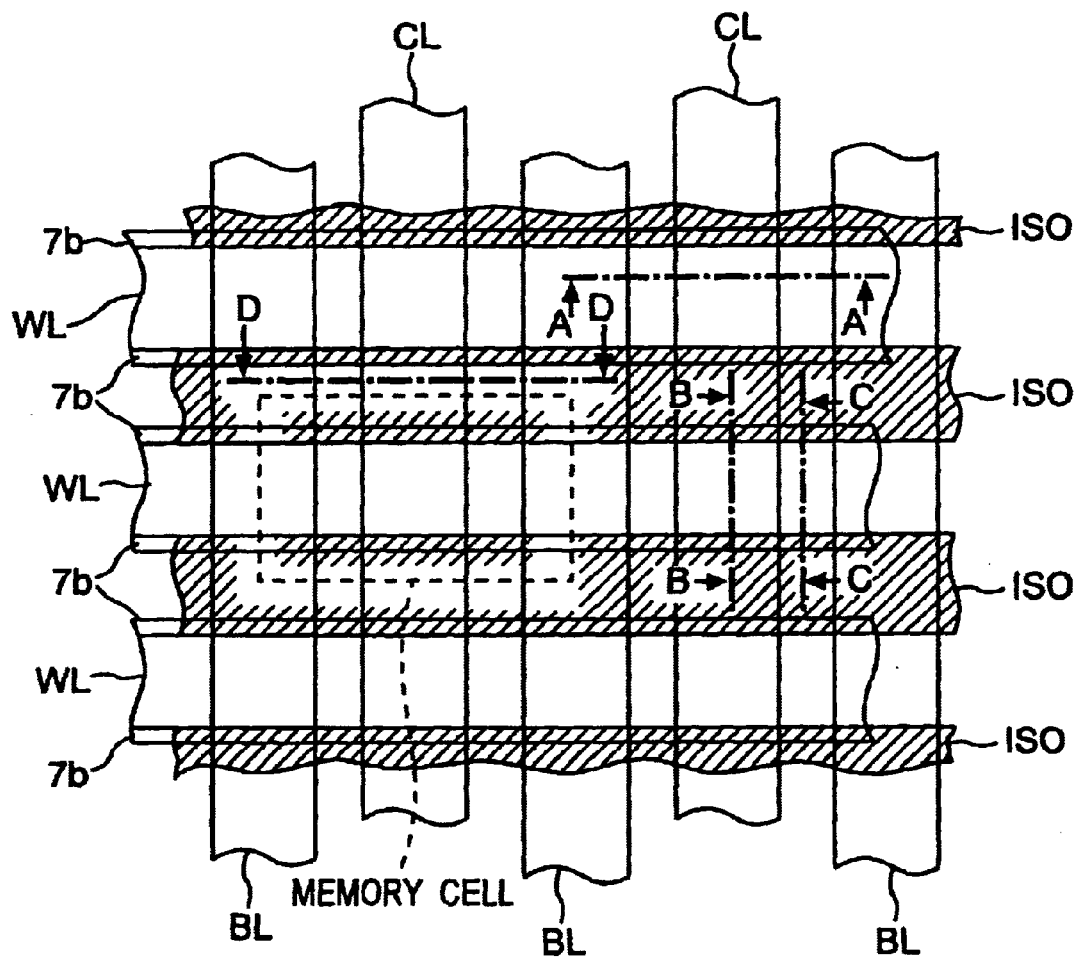
FIG. 8 is a plan view of a memory cell according to a second embodiment of the present invention.
Figure 9A:
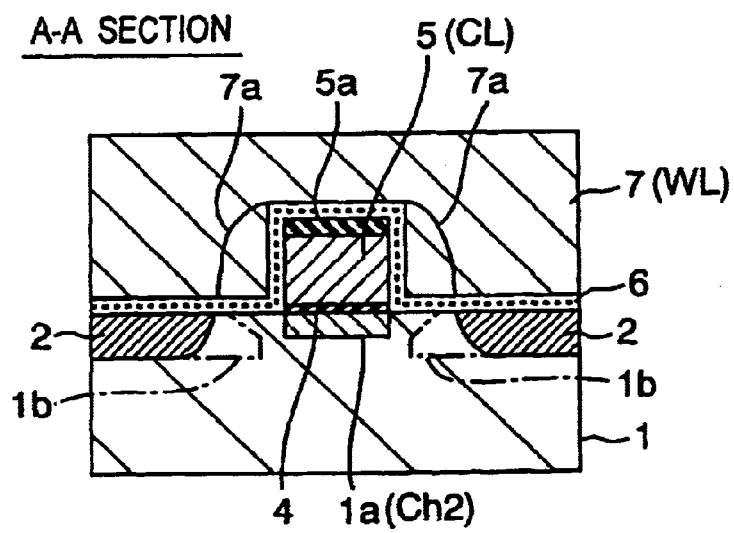
Figure 9B:
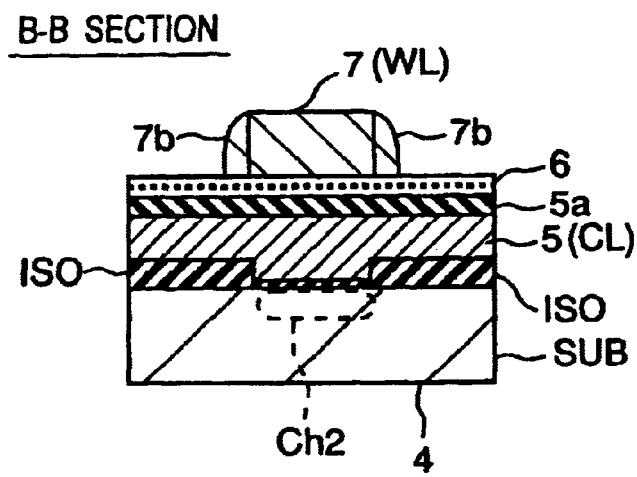
Figure 9C:
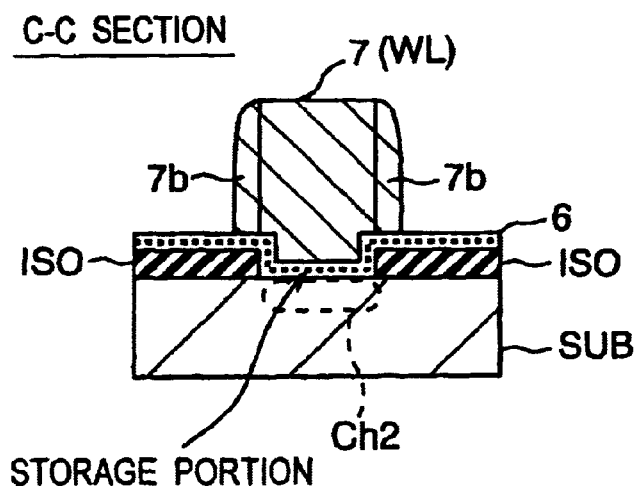

FIG. 8 is a plan view of a memory cell array according to the second embodiment. FIG. 9A is a sectional view along the line A–A of FIG. 8, FIG. 9B is a sectional view along the line B–B of FIG. 8, and FIG. 9C is a sectional view along the line C—C of FIG. 8.

The sectional structure along the channel direction in the memory cell is substantially the same as FIG. 1A according to the first embodiment. Note that in the second embodiment, an etching stop layer 5a is formed on the control gate electrode 5 (control line CL). The etching stop layer 5a is comprised of a material with a high etching selection ratio with respect to the polycrystalline silicon or amorphous silicon comprising the memory gate electrode 7 and which is not etched much at all under these etching conditions, for example, silicon nitride.

The reason why the etching stop layer 5a is provided is for preventing the control gate electrode 5 from being exposed to excessive etching due to the large difference in thickness between the thickness of the memory gate electrode 7 on the control gate electrode 5 and the thickness of the memory gate electrode 7 at its periphery. That is, when the etching stop layer 5a is not provided, at the time of etching the memory gate electrode 7, first the charge storing film 6 on the control gate electrode 5 is exposed, but this film cannot function sufficiently as an etching stopper because of its thin thickness of about 10 nm. It is etched off, the control gate electrode 5 is exposed, and then the control gate electrode 5 becomes thin due to the subsequent etching. The etching stop layer 5a is provided for preventing this unintentional etching of the control gate electrode 5.

Control gate electrodes 5 are, as shown in FIG. 8, arranged in stripe shapes longwise and parallel to the column direction as the control lines CL. Bit lines BL comprised of n-type impurity regions in the substrate 1 are arranged between the control gates CL parallel to the control lines. Word lines WL comprised of the memory gate electrodes 7 are arranged in long parallel stripes in a direction perpendicular to the bit lines BL and control lines CL.

In the second embodiment, dielectric isolation layers ISO overlapping the word lines WL by predetermined widths at the two ends in the width direction are arranged in long parallel stripes in the word line direction along with the spaces between the word lines WL.

Viewed by the portions of interconnections of the control gate electrode 5 of FIG. 9B, the channel width is defined by the distance between the dielectric isolation layers ISO. A single layer dielectric film (gate dielectric film) 4 is formed thinly on the inside channel region Ch2 between the dielectric isolation layers ISO. In this portion, an electric field is generated for controlling the channel. Further, at the two sides, the effect of the control gate electrode 5 on the substrate potential is sufficiently weakened due to the presence of the dielectric isolation layers ISO.

On the other hand, viewed by the portion of the storage portion of FIG. 9C, a charge storing film 6 is formed on the dielectric films ISO and the outside channel region Ch1 between them. A main part of the word line WL of a width substantially the same as the width of the space of the dielectric isolation layers ISO faces the outside channel region Ch1 across the dielectric retention film 6. The part of the charge storing film 6 contacting the outside channel region Ch1 is the storage portion. In a write or erase operation, the input or output of charges to the storage portion is controlled by the word line WL. In the second embodiment, even when a charge leaks out from the storage portion during repeated rewrites, since the dielectric isolation layers ISO are provided adjoining the two sides of the storage portion in the channel width direction, formation of a leak path in a region around the regular channel not affected by the electric field from the word line WL is effectively prevented.

Further, conductive sidewalls 7b are provided at the side faces of the word line WL. These conductive sidewalls 7b are provided for the purpose of enlargement of just the word line width without incurring an area penalty even when forming the widths of the line and space of a word line WL by the minimum limit F of photolithography. Further, another object of provision of the conductive sidewalls 7b is prevention of a region free from the effect of the electric field from the word line in the semiconductor region of the space between dielectric isolation layers ISO even when misalignment occurs at the time of formation of the word line in the pattern of formation of the dielectric isolation layers ISO.

Next, a method of manufacture of the memory cell according to the second embodiment will be explained along with FIG. 10A to FIG. 10D and referring to other drawings. These FIG. 10A to FIG. 10D show cross-sections taken along to the line D—D of FIG. 8 and, as process steps, correspond to the steps of FIG. 5A to FIG. 5D.

Figure 10A:
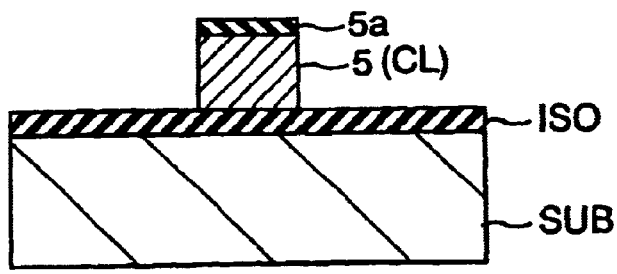

In FIG. 10A, first, a dielectric isolation layer ISO is formed on the substrate 1 in the plan pattern shown in FIG. 8. The dielectric isolation layer ISO is formed by local oxidation of silicon (LOCOS), shallow trench isolation (STI), or field isolation. The thickness of the dielectric isolation layer ISO is a thickness by which a channel is not formed in a semiconductor region contacting the bottom face thereof, for example, from 10 and several nm to several 10 nm. Accordingly, since this is not that large as a step difference, it is possible to adopt field isolation of the simplest order of formation. In field isolation, the substrate surface is thermally oxidized or silicon dioxide is formed by CVD and then patterned.

A gate dielectric film 4 is formed by thermal oxidation on the part of the substrate surface, shown in FIGS. 9B and 9C, which is exposed from the dielectric isolation layer ISO.

Then, channel doping which determines the threshold voltage of the inside channel region Ch2 is performed using this gate dielectric film 4 as a through mask.

An impurity-doped polycrystalline silicon or amorphous silicon and a silicon nitride film 5a serving as the etching stop layer are formed in that order on the dielectric isolation layer ISO and channel forming region Ch. These films are patterned into stripes longwise in the column direction to form a stacked pattern of the control gate electrode 5 and the etching stop layer 5a.

Figure 10B:
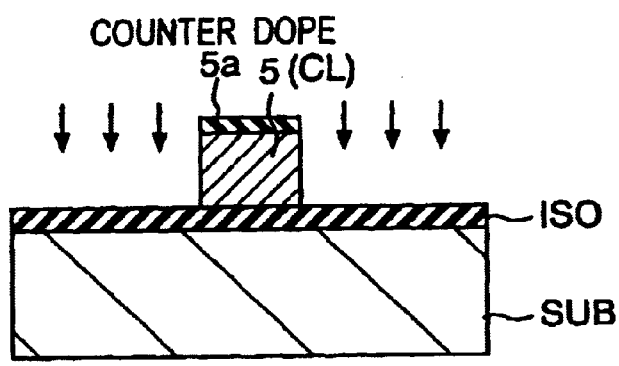

In FIG. 10B, as needed, channel doping means doping of impurity ions of a reverse conductivity type (counter doping) in the parts of the channel forming region Ch outside from the control gate electrode 5 (counter doping). Due to this, an outside channel region Ch1 with a low threshold voltage is formed.

Figure 10C:
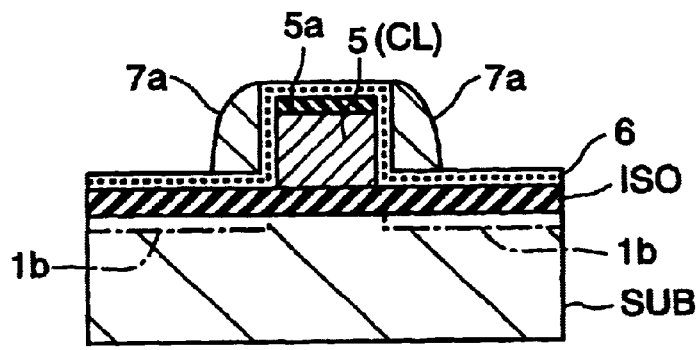

In FIG. 10C, the gate dielectric film 4 is patterned in the same way using the control gate electrode 5 as a mask, then the charge storing film 6 is formed over its entire surface. As the charge storing film 6, it is possible to use a three-layer film comprised of the bottom dielectric film $6_{-1}$, the main charge storing film $6_{-2}$, and the top dielectric film $6_{-3}$. This method of formation is the same as the first embodiment.

In the same way as in the first embodiment, sidewalls 7a are formed close to side faces of the control gate electrode 5 and comprised of a conductive material. Further, as needed, n-type or p-type impurities 1b are doped into deep portions of the substrate by slanted ion implantation for the purpose of adjustment of the threshold voltage or improvement of the punch through endurance.

Figure 10D:
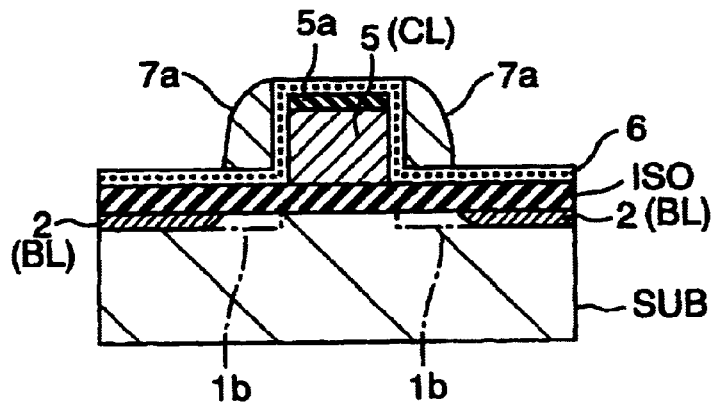

In FIG. 10D, first, an n-type impurity is doped in a high dose by substantially vertical ion implantation. Due to this, the S/D impurity regions 2 (bit lines BL) are formed, but these S/D impurity regions 2 are formed buried under the dielectric isolation layer ISO at locations intersecting with the lines of the dielectric isolation layer ISO.

Next, the same conductive material as the side walls 7a is deposited thickly on the entire surface and patterned to process it into a parallel stripe and form the memory gate electrode 7. Further, the same conductive material is deposited thickly on the entire surface and etched back. Due to this, a word line WL having side walls 7b on its two sides is formed at a location not illustrated in FIG. 10D.

Next, as needed, an interlayer insulating layer is deposited, contacts are formed, and the upper interconnection layer is formed to complete this nonvolatile semiconductor memory device.

In this way, when using field isolation, a dielectric isolation layer ISO is formed by just adding the steps of deposition and patterning of a dielectric film at the start of the method of manufacture of the first embodiment, then performing the same processes as the first embodiment.

These steps are minor compared with the overall producing process of a nonvolatile semiconductor memory device and do not cause a major increase in costs.

Third Embodiment

The third embodiment relates to a second dialectic isolation structure.

Figure 11:
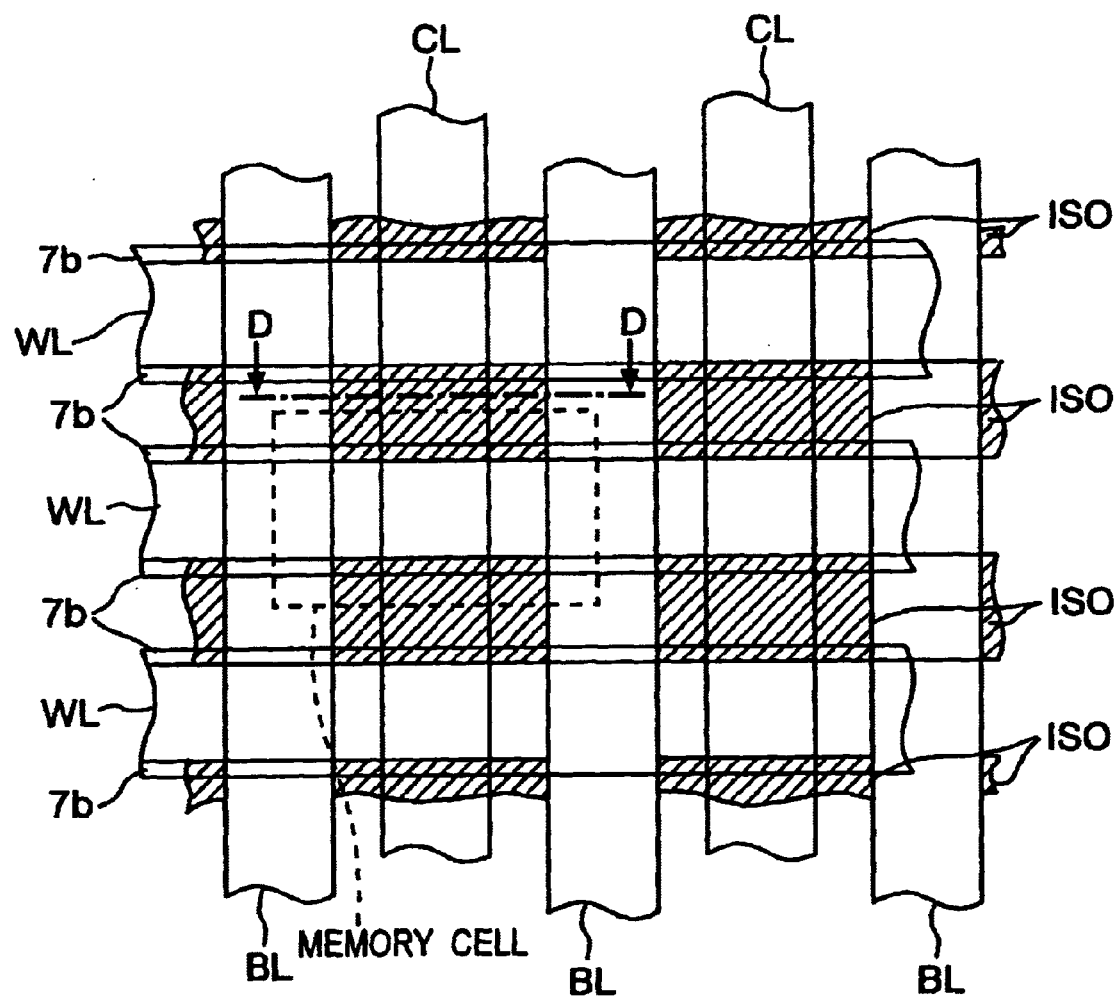
FIG. 11 is a plan view of a memory cell according to a third embodiment of the of the present invention.

FIG. 11 is a plan view of a memory cell array according to the third embodiment.

In this third embodiment, the sectional structure along the channel direction in the memory cell is basically the same as the first and second embodiments (FIG. 1A). Further, the structures seen in the sectional views as FIG. 9A, FIG. 9B, and FIG. 9C are the same as in the second embodiment.

That is, in the portions shown in FIG. 9B and FIG. 9C, the dielectric isolation layer ISO is formed in the same way as the second embodiment. Therefore, the effects of the control gate electrode 5 and the word line WL on the substrate potential are sufficiently weakened, the effect of the charge leaking out from the storage portion on the substrate potential is sufficiently reduced, and thereby occurrence of a leakage current is prevented.

Further, the formation of the etching stop layer 5a on the control gate electrode 5, the effect thereof, the formation of conductive sidewalls at the two side faces of the word line WL, and the effect thereof are the same as explained in the second embodiment.

Figure 12D:
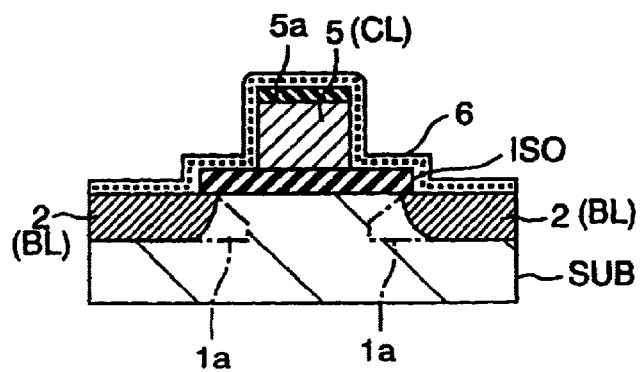

In the third embodiment, as shown in FIG. 11, a dielectric isolation layers ISO overlapping the word lines WL by a certain width at their two ends in the width direction are arranged in the spaces between the word lines WL and isolated above the S/D impurity regions 2 comprising the bit lines BL. FIG. 12D is a sectional view taken along with the line D—D of FIG. 8.

In FIG. 12D, an isolated pattern of a dielectric isolation layer ISO is arranged only on a semiconductor region between the S/D impurity regions 2 forming the bit lines BL. A stacked pattern of the control gate electrode 5 and the etching stop layer 5a is arranged on the dielectric isolation layer ISO. A charge storing film 6 is formed to cover these and the S/D impurity regions 2.

Next, a method of manufacture of the memory cell according to the third embodiment will be explained along with FIG. 12A to FIG. 12D while referring to the other drawings. FIG. 12A, FIG. 12B, and FIG. 12D correspond, as process steps, to the steps of FIG. 5A, FIG. 5B, and FIG. 5D. Also, the steps of FIG. 12C1 and FIG. 12C2 correspond to the step of FIG. 5C.

In FIG. 12A, a dielectric isolation layer ISO is formed on the substrate 1 by the same method and the same pattern as in the second embodiment, that is, in a long parallel stripe in the row direction. The thickness of the dielectric isolation layer ISO has a thickness not forming a channel in a semiconductor region contacting the bottom face thereof, for example, from 10 or so nm to several 10 nm.

Next, in the same way as in the second embodiment, a gate dielectric film 4 is formed by thermal oxidation on the substrate surface exposed by the dielectric isolation layer ISO, then channel doping which determines the threshold voltage of the inside channel region Ch2 is performed using this gate dielectric film 4 as a through mask.

An impurity-doped polycrystalline silicon or amorphous silicon and silicon nitride film 5a serving as the etching stop layer are formed in that order on the dielectric isolation layer ISO and channel forming region Ch. These films are patterned into a stripe longwise in the column direction to form a stacked pattern of the control gate electrode 5 and the etching stop layer 5a.

In FIG. 12B, in the same way as the second embodiment, as needed, an impurity of a reverse conductivity type from the channel doping is doped into the channel forming region Ch outside the control gate electrode 5 (counter doping). Due to this, an outside channel region Ch1 with a low threshold voltage is formed.

In FIG. 12C1, first, side walls 8 comprised of a material having a slower etching rate in comparison with the material of the dielectric isolation layer ISO are formed along with the two sides in a width direction of the stacked pattern of the control gate electrode 5 and the etching stop layer 5a. As the material, for example silicon nitride is selected when the dielectric isolation layer ISO is silicon dioxide. Etching is performed using the side walls and the etching stop film 5a as masks. Due to this, a dielectric isolation layer ISO of a line shape longwise in the row direction is separated above a region of formation of the S/D impurity regions to form an isolated pattern for each cell.

According to need, an n-type or p-type impurity 1b is doped into a deep portion of the substrate by slanted ion implantation for the purpose of adjustment of the threshold voltage or improvement of the punch through endurance using as a mask the same sidewalls 8 and etching stop layer 5a. Next, an n-type impurity is implanted at a high dosage. Due to this, as shown in FIG. 11, the S/D impurity regions 2 forming the bit lines BL are formed in patterns-of long parallel strips in the row direction separated by exactly the width of the sidewalls 8 at the two sides of the control gates 5.

The side walls 8 are selectively removed, then, as shown in FIG. 12C-2, a charge storing film 6 is formed on the entire surface. As the charge storing film 6, a three-layer film comprised of the bottom dielectric film $6_{-1}$, the main charge storing film $6_{-2}$, and the top dielectric film $6_{-3}$ may be used. This method of formation is the same as in the first embodiment.

A conductive material is deposited thickly on the entire surface and patterned to process it in a parallel stripe to form the memory gate electrode 7. Then, the same conductive material is deposited thickly on the entire surface, then etched back. Due to this, a word line WL which has sidewalls 7b on the two sides is formed at a location not illustrated in FIG. 12D.

Next, as needed, an interlayer insulating layer is deposited, contacts are formed, and the upper interconnection layer is formed to complete this nonvolatile semiconductor memory device.

In the above method of production, the separation of dielectric isolation layers ISO and formation of S/D impurity regions are performed by self-alignment with the control gate 5. Accordingly, there is no fluctuation in dimensions of the storage portions 6a, 6b in the channel direction in the same way as in the first and second embodiments. Further, in the third embodiment, the photomask for forming the pattern of the dielectric isolation layer ISO is the same as used in the second embodiment. When using field isolation for forming the dielectric isolation layer ISO, the dielectric isolation layer ISO is formed by just adding the steps of depositing and patterning a dielectric film at the start of the method of manufacture of the first embodiment. Then, the same processes as the first embodiment can be performed.

These steps are minor compared with the overall producing process of a nonvolatile semiconductor memory device and do not cause a major increase in costs.

Fourth Embodiment

The fourth embodiment relates to the serial operations of a VG cell array (FIG. 4) using memory cells of the structure according to the present invention.

In the present invention, one of the reasons for providing the control gate electrode is to realize serial operations in a VG cell array. Below, a write operation using this array control method will be explained.

Figure 13:
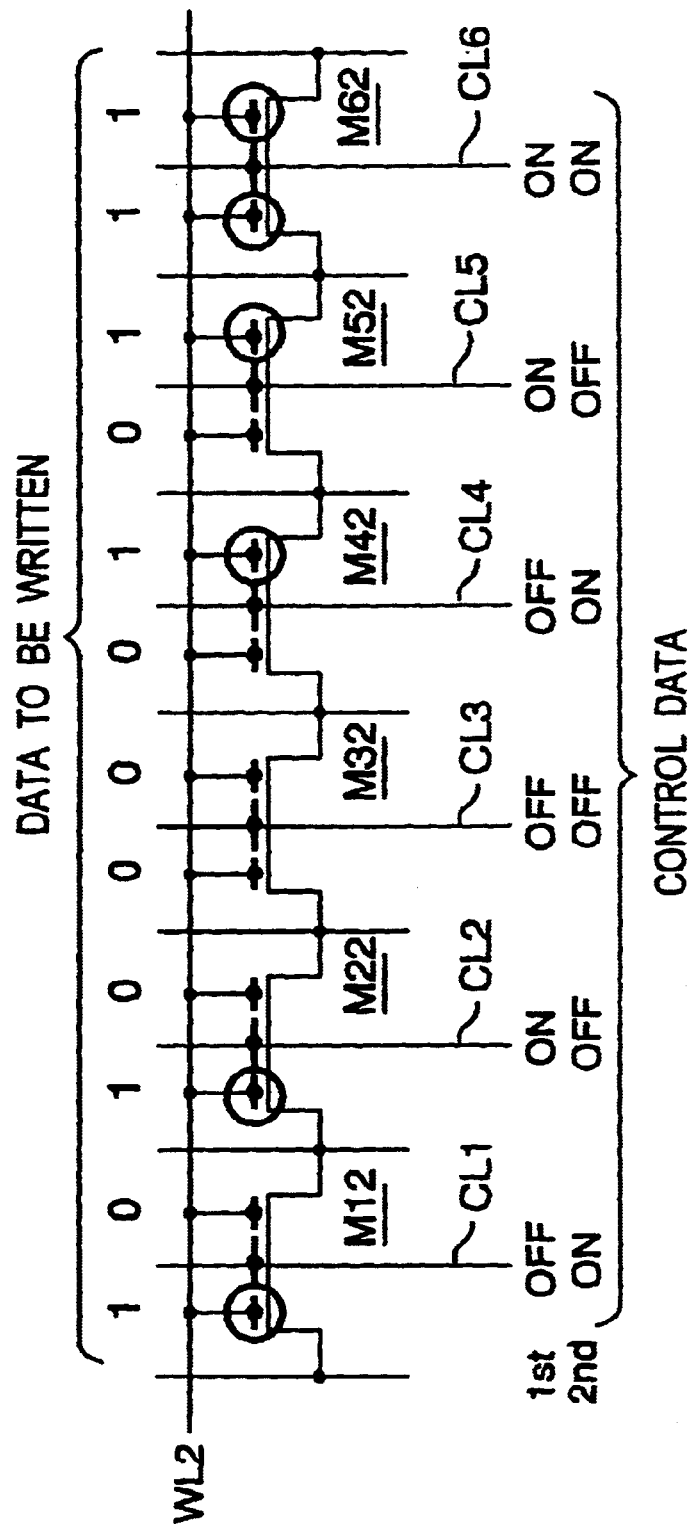
FIG. 13 is a view explaining the case of writing 12 bits of data (1, 0, 1, 0, 0, 0, 0, 1, 0, 1, 1, 1) in two rows of six memory cells by a parallel write operation by two CHE injection write operations.

FIG. 13 illustrates the case of writing 12 bits of data (1, 0, 1, 0, 0, 0, 0, 1, 0, 1, 1, 1) in six memory cells of a second row by a parallel write operation by two CHE injection write operations. Here, "ON" indicates the state where a channel can be formed in the memory cell (or voltage producing this state), while "OFF" indicates the state where a channel cannot be formed in the memory cell (or voltage producing this state).

Figure 14:
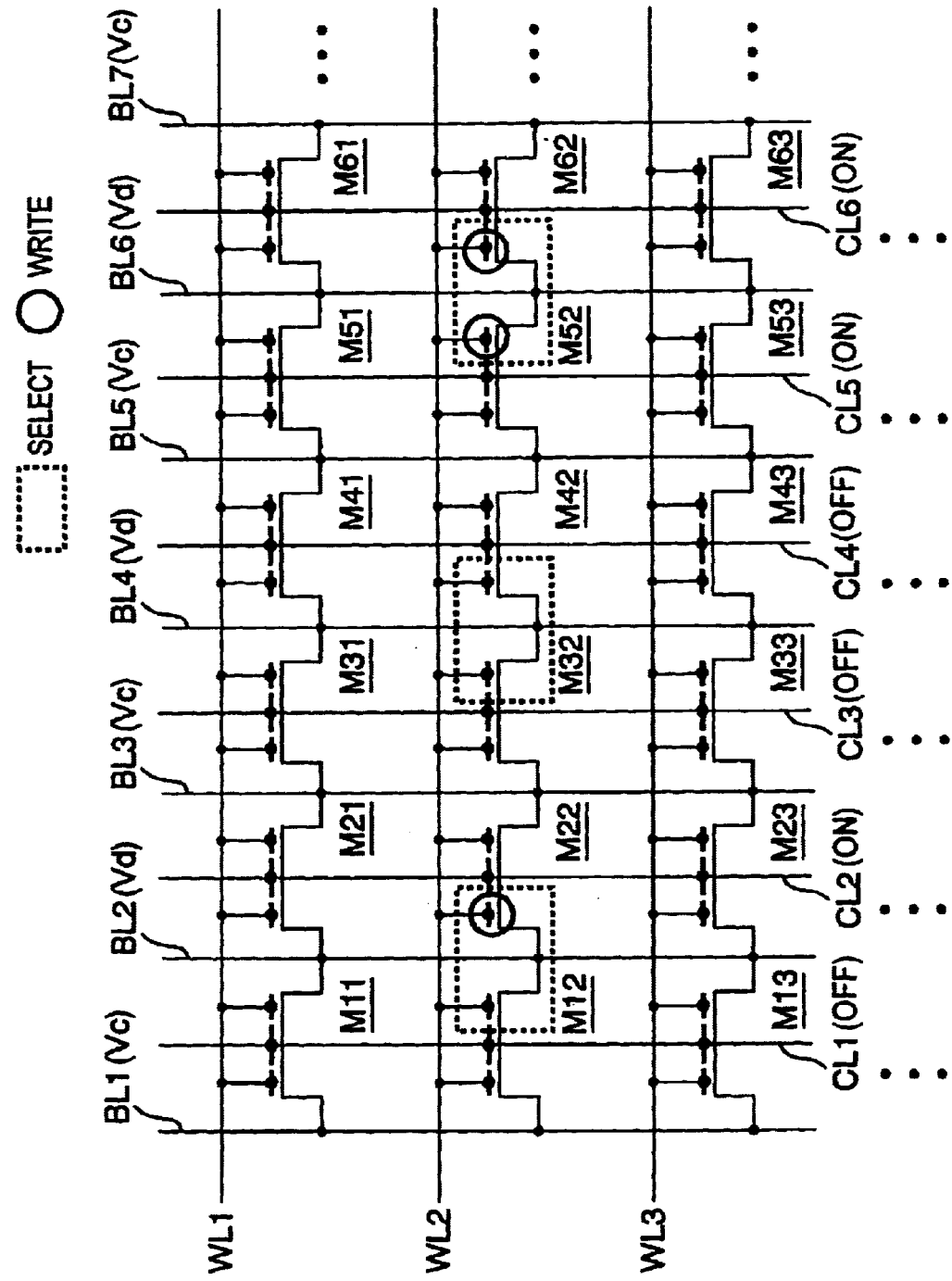
FIG. 14 is a circuit diagram explaining the first serial write operation of a VG type cell array according to the fourth embodiment.

FIG. 14 illustrates the first write operation.

At this time, a common voltage Vc (for example, the ground voltage) is applied to the odd-numbered bit lines, while a specified positive voltage (drain voltage Vd) is applied to the even-numbered bit lines. The CHE write operation is performed in the drain side storage portion, so the storage portions at the two sides of the bit lines BL2, BL4, BL6 to which the drain voltage vd is applied are selected and thereby can be written in. The actual write operation is possible only when the control lines are "ON". Therefore, writing is performed at three locations, that is, the storage portion on the left side of the control line CL2, the storage portion on the right side of the control line CL5, and the storage portion on the left side of the control line CL6. The stored data becomes "1" in each region. The other storage portions in the selected locations remain "0", that is, the erasure state.

Figure 15:
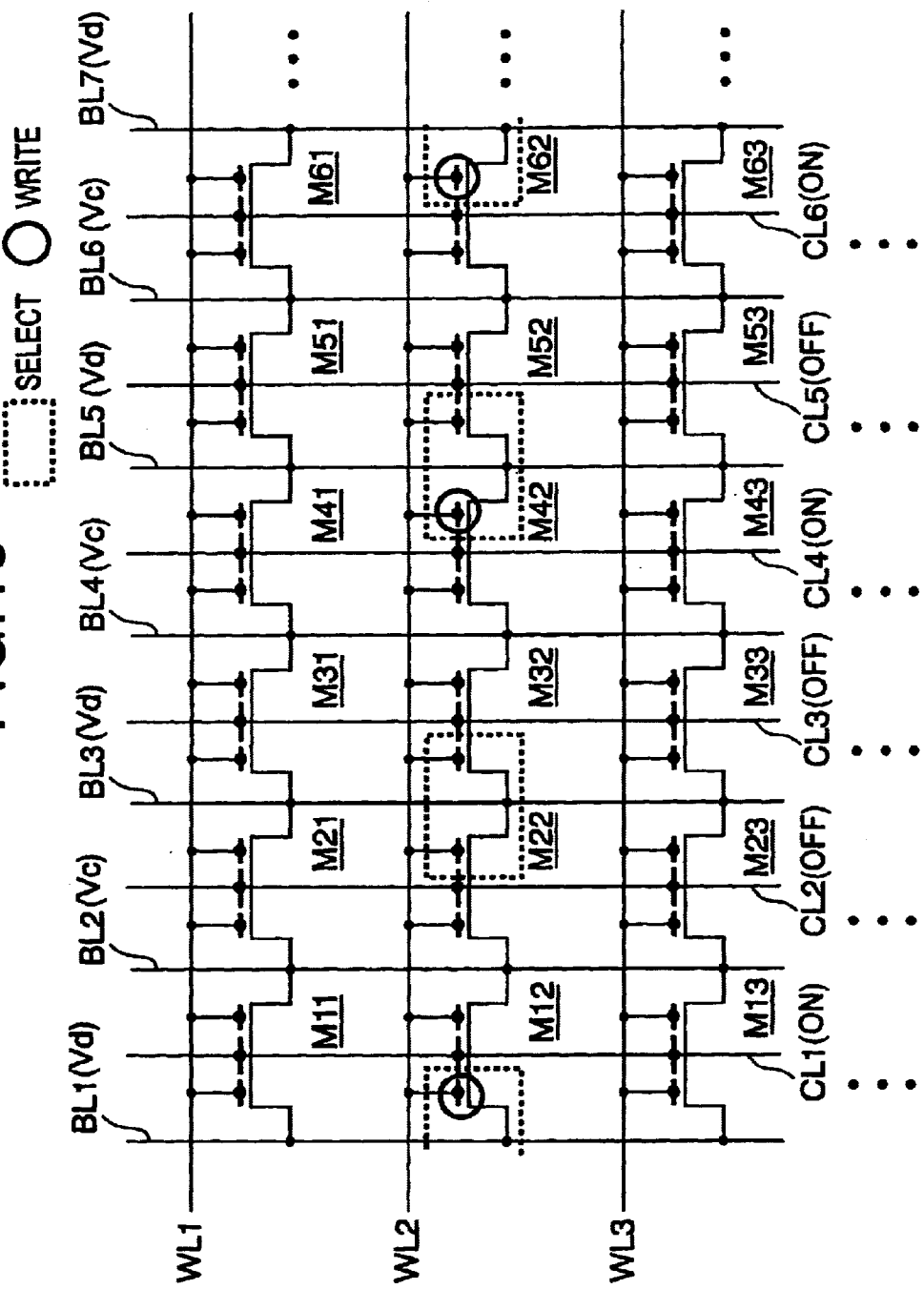
FIG. 15 is a circuit diagram explaining the second serial write operation of a VG type cell array according to the fourth embodiment.

FIG. 15 illustrates the second write operation.

At this time, where the common voltage Vc and the drain voltage Vd are applied are switched from the time of the above first write operation. Therefore, the storage portions selected become all of the locations remaining after not being selected the first time. In this case as well, the actual write locations are determined by the control data. In the example of FIG. 15, three regions are written, that is, the storage portion on the left side of the control line CL1, and the storage portion on the right side of the control line CL4, and the storage portion on the right side of the control line CL6. The stored data becomes "1" in each portion. The rest of the storage portions other than the selected locations remain "0", that is, in the erasure state.

Due to these two parallel write operations, the 12 bits of write data shown in FIG. 4 are written into the six memory cells connected to one word line WL2.

As shown above, in the memory cell according to the present embodiment, due to the presence of the control gate electrode 5 controlling the channel formation, serial access and serial operations become possible with only a few operation cycles for a VG cell array. Further, the level of the bit lines, which are comprised of impurity regions of a semiconductor, have large time constants, and cannot be switched at a high speed, is raised and lowered only once, so is advantageous for reduction of the time required for the read operation. Further, this is advantageous for reduction of the energy consumption.

To write data to the entire memory cell array, it is preferable to set the potential of the bit lines once, then successively write all rows while keeping the potential fixed, reverse the bit line potential, then successively write all rows while keeping the potential fixed. In the first write operation for all of the rows, the write operation is performed on one of the two storage portions, then in the second write operation, the write operation is performed in the other of the two storage portions.

In a write operation on the entire VG type memory cell array, serial access and serial operations can be performed with only a small number of operation cycles. Further, the level of the bit lines, which are comprised of impurity regions of a semiconductor, have large time constants, and cannot be switched at a high speed, is raised or lowered only once, so is advantageous for reduction of the time required for the write operation and reduction of the energy consumption.

Next, the read operation will be explained.

Because the storage state of the source side storage portion is read in the read operation, the one of the storage portions on the two sides of the control gate to which the common voltage Vc is applied opposite to the time of the write operation is selected. If the memory cells on the two sides of the bit lines on which the drain voltage is applied are connected, mistaken operations arise, therefore it is necessary to read one side each of every other memory cell. Therefore, four operation cycles are needed to read one row.

Figure 16:
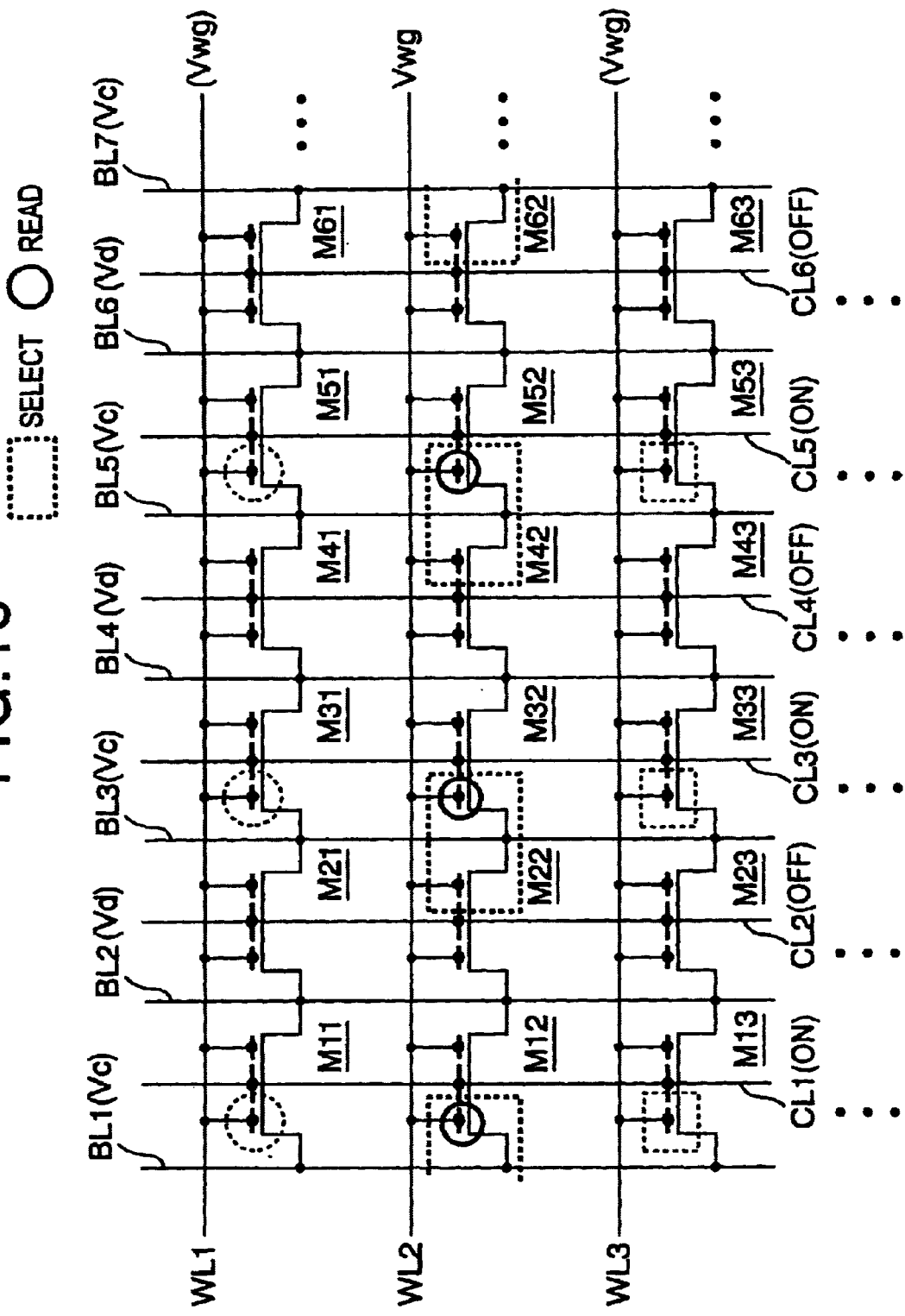
FIG. 16 is a circuit diagram explaining the first serial read operation of a VG type cell array according to the fourth embodiment.

FIG. 16 illustrates the first read operation.

In the initial state, a common voltage Vc is applied to all bit lines, and all control lines are maintained at the OFF voltage.

First, a common voltage Vc (for example, the ground voltage) is applied to the odd-numbered bit lines, and a specified positive voltage (drain voltage Vd) is applied to the even-numbered bit lines. Because the read operation is performed on the source side storage portion, the storage portions at the two sides of the bit lines BL1, BL3, BL5, BL7 to which the common voltage Vc is applied are selected, whereby reading becomes possible.

The odd-numbered control lines CL1, CL3, CL5, CL7 are turned "ON" from "OFF". A word gate voltage Vwg is applied to the word line WL2 to activate it. In an actual read operation, it is possible to read only the memory cells whose control lines are "ON". Therefore, the bits of data of the storage portions indicated by "O" in FIG. 16 can be read. That is, a read current flows in the memory cells M12, M32, and M52 in accordance with the stored data at the three locations of the storage portion on the left side of the control line CL1, the storage portion on the left side of the control line CL3, and the storage portion on the left side of the control line CL5. The logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL2 is returned to its initial potential and deactivated.

Figure 17:
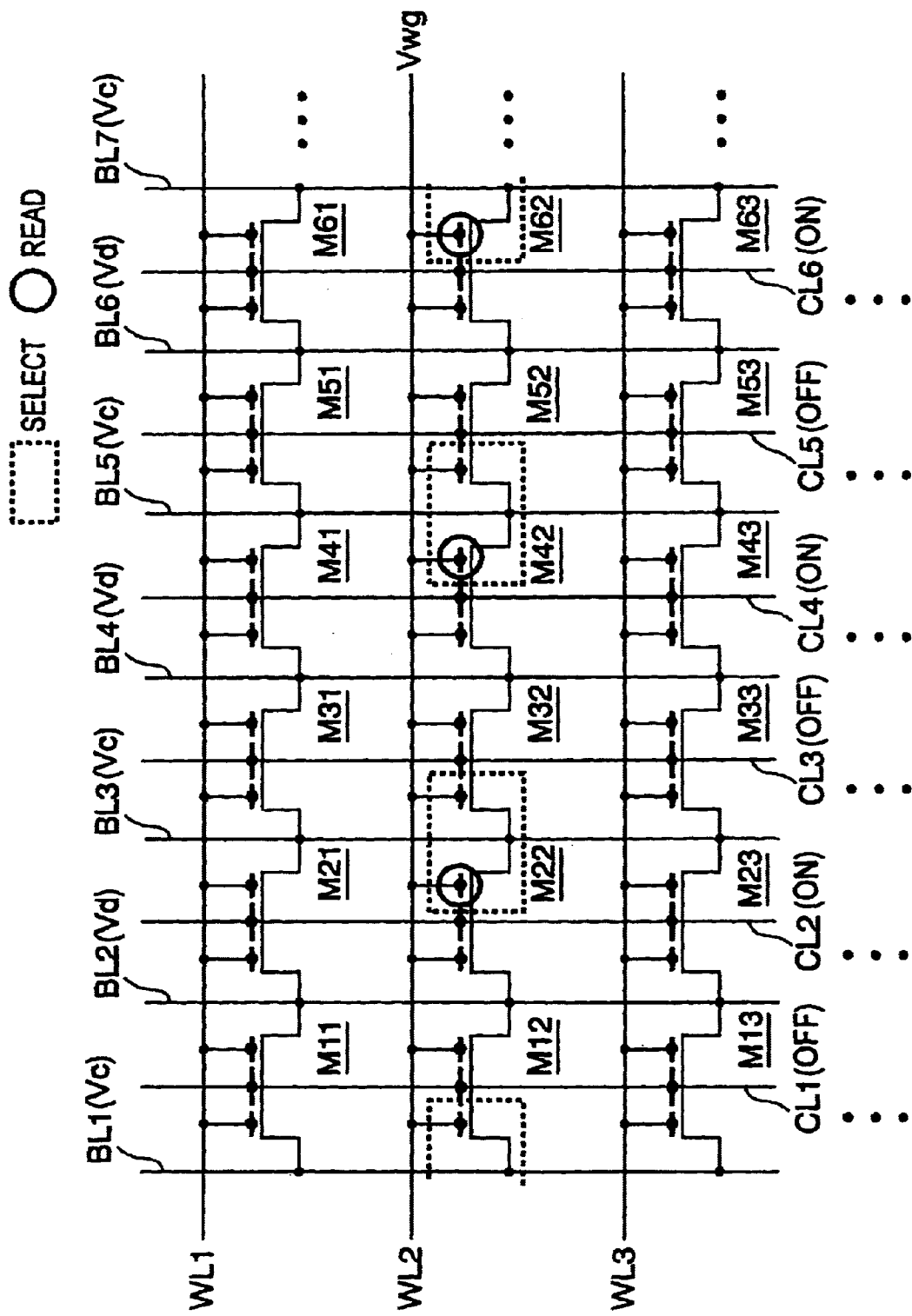
FIG. 17 is a circuit diagram explaining the second serial read operation of a VG type cell array according to the fourth embodiment.

FIG. 17 illustrates the second read operation.

The relative voltages of the control lines are switched to be reverse to those of the first read operation. Namely, the odd-numbered control lines CL1, CL3, CL5, CL7 are turned "OFF" from "ON", while the even-numbered control lines CL2, CL4, CL6 are turned "ON" from "OFF". In addition, a word gate voltage Vwg is applied to the word line WL2 to activate it. At this time, only the memory cells whose control lines are "ON" can be read. Therefore, the bits of data of the storage portions indicated by "O" in FIG. 17 can be read. That is, a read current flows inside the memory cells M22, M42, and M62 in accordance with the stored data at the three locations of the storage portion on the right side of the control line CL2, the storage portion on the right side of the control line CL4, and the storage portion on the right side of the control line CL6. In accordance with this, the logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL2 is returned to its initial potential and deactivated and all of the bit lines and all of the control lines are returned to their initial states once.

Figure 18:
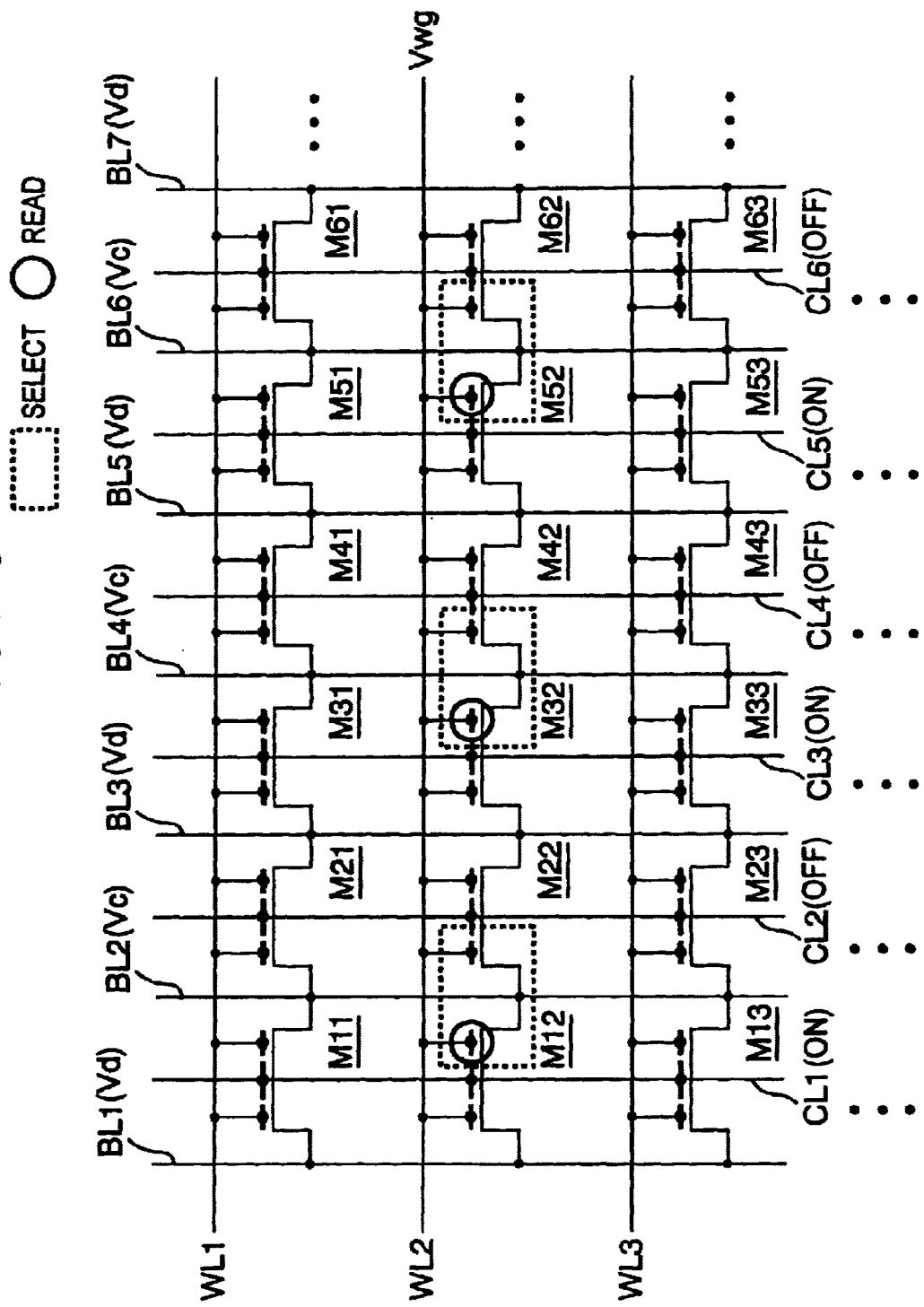
FIG. 18 is a circuit diagram explaining the third serial read operation of a VG type cell array according to the fourth embodiment.

FIG. 18 illustrates the third read operation.

First, the relative voltages of the bit lines are switched to be reverse from the first and second read operations. That is, the drain voltage Vd is applied to the odd-numbered bit lines, while the common voltage Vc is applied to the even-numbered bit lines. Therefore, the storage portions at the two sides of the bit lines BL2, BL4, BL6 to which the common voltage Vc is applied are selected, whereby they can be read.

Odd-numbered control lines CL1, CL3, CL5, CL7 are turned "OFF" from "ON" and a word gate voltage Vwg is applied to the word line WL2 to activate the same. At this time, only the memory cells whose control lines are "ON" can be read. Therefore, the bits of data of the storage portions indicated by "O" in FIG. 18 can be read. That is, a read current flows inside the memory cells M12, M32, and M52 in accordance with the stored data at the three locations of the storage portion on the right side of the control line CL1, the storage portion on the right side of the control line CL3, and the-storage portion on the right side of the control line CL5. In accordance with this, the logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL2 is returned to its initial potential and deactivated.

Figure 19:
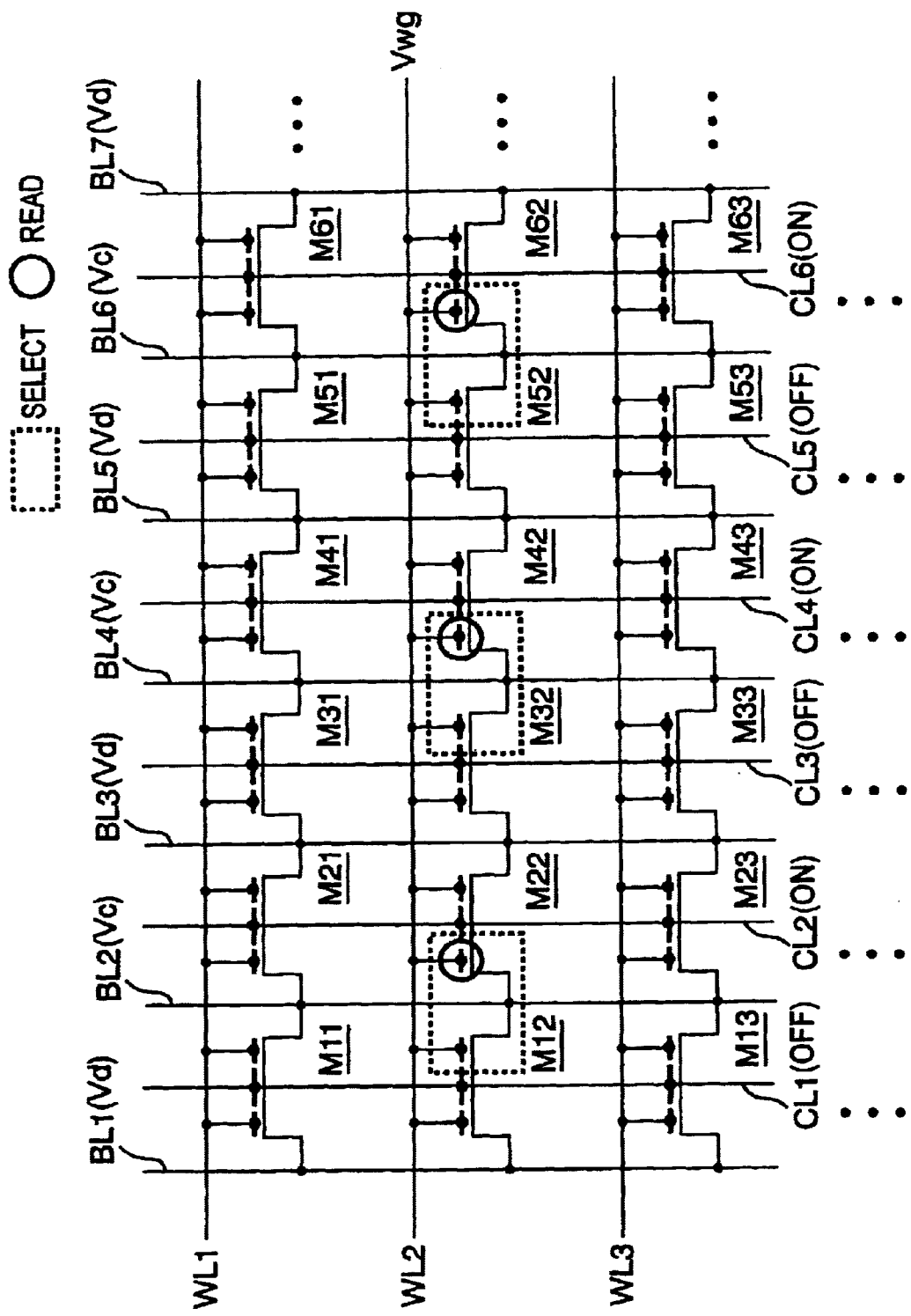
FIG. 19 is a circuit diagram explaining the fourth serial read operation of a VG type cell array according to the fourth embodiment.

FIG. 19 illustrates the fourth read operation.

The relative voltages of the control lines are reversed from the third read operation. That is, the odd-numbered control lines CL1, CL3, CL5, CL7 are turned "OFF" from "ON", and the even-numbered control lines CL2, CL4, CL6 are turned "ON" from "OFF". In addition, a word gate voltage Vwg is applied to the word line WL2 to activate it. At this time, only the memory cells whose control lines are "ON" can be read. Therefore, the bits of data of the storage portions indicated by "O" in FIG. 19 can be read. That is, a read current flows inside the memory cells M22, M42, and M62 in accordance with the stored data at the three locations of the storage portion on the left side of the control line CL2, the storage portion on the left side of the control line CL4, and the storage portion on the left side of the control line CL6. In accordance with this, the logic of the stored data is identified according to whether the potentials of the even-numbered bit lines move in the positive direction, whether the potentials of the odd-numbered bit lines move in the negative direction, or the potential difference between the bit lines BL1 and BL2, BL3 and BL4, or BL5 and BL6.

After the stored data is identified, the word line WL2 is returned to its initial potential and deactivated and all of the bit lines and all of the control lines are returned to their initial states once.

By the above four operations, the bits of data of all the memory cells connected to the same word line WL are read out.

When reading data from the entire memory cell array or from part of the same, that is, a memory cell block, in the above four read operations, the same operation is repeated for exactly the number of word lines while successively switching the word lines to be activated.

For example, when successively performing read operations of a block comprised of the 3×6 memory cells shown in FIG. 16 in the order of the first, second, third, and fourth operation, the number of the read operation cycles in each read operation from the first to fourth operations is three or equal to the number of the word lines. Therefore, a total of 12 read cycles are needed.

First, the first read operation will be explained.

In this case as well, in the initial state, a common voltage Vc is applied to all bit lines, and all control lines are maintained at the OFF voltage.

First, a common voltage (for example, ground voltage) is applied to the odd-numbered bit lines, and a specified positive voltage (drain voltage Vd) is applied to the even-numbered bit lines. Since the read operation is performed on the source side storage portions, the storage portions at the two sides of the bit lines BL1, BL3, BL5, BL7 to which the common voltage Vc is applied are selected and thereby can be read.

The odd-numbered control lines CL1, CL3, CL5, CL7 are turned "ON" from "OFF" and a word gate voltage Vwg is applied to the first word line WL1 to activate it. In the actual read operation, only the memory cells whose control lines are "ON" can be read. Therefore, the bits of data of the storage portions indicated by broken line "O" in FIG. 16 can be read. That is, a read current flows inside the memory cells M12, M32, and M52 in accordance with the stored data at the three locations of the storage portion on the left side of the control line CL1, the storage portion on the left Bide of the control line C13, and the storage portion on the left side of the control line CL5 in the row of memory cells connected to the word line WL1. In accordance with this, the logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL1 is returned to its initial potential and deactivated.

In the second cycle, the word gate voltage Vwg is applied to the second word line WL2 to activate it.

In the actual read operation, only the memory cells whose control lines are "ON" can be read. Therefore, the bits of data of the storage portions indicated by the "O" in FIG. 16 can be read. That is, a read current flows inside the memory cells M12, M32, and M52 in accordance with the stored data at the three locations of the storage portion on the left side of the control line CL1, the storage portion on the left side of the control line C13, and the storage portion on the left side of the control line CL5 in the row of memory cells connected to the word line WL2. In accordance with this, the logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL2 is returned to its initial potential and deactivated.

In the third cycle, the word gate voltage Vwg is applied to the third word line WL3 to activate it. In the actual read operation, only the memory cells whose control lines are "ON" can be read. Therefore, the bits of data of the storage portions indicated by the square marks in FIG. 16 can be read. That is, a read current flows inside the memory cells M12, M32, and M52 in accordance with the stored data at the three locations of the storage portion on the left side of the control line CL1, the storage portion on the left side of the control line C13, and the storage portion on the left side of the control line CL5 in the row of memory cells connected to the word line WL3. In accordance with this, the logic of the stored data is identified according to whether the potentials of the odd-numbered bit lines move in the positive direction, whether the potentials of the even-numbered bit lines move in the negative direction, or the potential difference between the bit lines BL1 and BL2, BL3 and BL4, or BL5 and BL6.

After the stored data is identified, the word line WL3 is returned to its initial potential and deactivated.

In the same way, by repeating the second to fourth read operations three cycles, the bits of data of all of the memory cells shown in FIG. 16 are read.

In the read operation of the memory cell array, the level of the potential of the bit lines with the large time constants is raised or lowered only twice. This contributes to improvement of the overall speed of the read operation and reduction of the power consumption.

Note that in an erasure operation, usually the entire memory cell array is erased simultaneously, but erasure in row units is also possible. With the erasure by channel hot hole (with p-channel type, CHE) injection, erasure can be performed for each row by two operation cycles in the same way as CHE injection write operations. With erasure by breakdown induced hot hole (with p-channel type, hot electron) injection, erasure can be performed for each row by a single operation cycle.

Such a serial operation is a form of operation by dividing the memory cell array in the present invention into several parts. That is, in the present invention, a predetermined number of memory cells turned OFF by their control lines are provided, for example, 2, 3, 4, preferably, 2, 4, 8, 16, to divide the memory cells into n number of groups. Then, a total n number of memory cells among the nonactivated memory cells are serially accessed one by one for a package operation (write, read, and erasure).

In the next cycle, the nonactivated memory cells are shifted in one direction to form new groups and similarly n number of memory cells are operated. This operation is repeated by exactly the number of memory cells in a group to complete the operation of all the memory cells connected to one word line WL.

Fifth Embodiment

The fifth embodiment relates to a method of setting the gate bias of nonselected rows in order to decrease the leakage current flowing to the bit lines from the row the same as the cells to be read in a read operation. Here, the explanation will be given taking as an example a NOR type (separated source line NOR type) memory cell array wherein source lines in the column direction are divided between adjacent memory cells as shown in FIG. 3 and a VG type memory cell array wherein the common lines are shared between adjacent memory cells as shown in FIG. 4.

FIG. 20 shows the specific bias conditions of read operation in a separated source line NOR type memory cell array.

In the separated source line NOR type memory cell array, it is possible to read in parallel one bit at a time from each memory cell in the same row by a single read operation cycle. The bias conditions in FIG. 20 correspond to the page read selecting all of the memory cells M12, M22, ... M62 connected to the selected word line WL2, in particular the case of simultaneously reading the bits of data stored at the left sides of the control lines in the memory cells.

A read drain voltage Vd of, for example, 1.2V, is applied to all of the bit lines BL1 to BL6, a reference voltage Vs, for example, 0V, is applied to all of the source lines SL1 to SL6, and a read gate voltage Vwg, for example, the power supply voltage 3.3V, is applied to the selected word line WL2. Further, in a page read operation, a control gate voltage Vcg, for example, 3V, for turning on a channel is applied to all of the control lines CL1 to CL6.

At the present time, in the present embodiment, a voltage giving a forward bias to the channel forming region is applied to the nonselected word lines WL1, WL3. Here, voltage giving a forward bias to the channel forming region means a voltage whereby the direction of application of voltage based on the potential of the channel forming region becomes a forward direction assuming a pn junction. Specifically, for example in FIG. 1, when the channel forming regions Ch1a, Ch1b are p-types and are held at the ground potential, the voltage is a negative voltage, while conversely when the channel forming regions Ch1a, Ch1b are n-types and are held at the ground potential, the voltage is a positive voltage. The voltage in a direction giving a forward bias to the channel forming region is preferably not more than 1V in terms of absolute value. This is to reduce the disturbance and prevent mistaken writing and mistaken erasure when reading a nonselected memory transistor.

Here, as the forward bias voltage Wuw, for example, −0.5V is applied.

In memory cells, the threshold voltage changes according to the logic of the stored data, so under the same bias conditions for selected memory cells, the channel conductivity of the memory transistors effectively changes in accordance with the logic of the stored data and therefore changes occur in the amount of current flowing to the bit lines or changes occur in the potential of the bit lines. In general, an effective read current flows in a selected bit line BL only when the selected memory cell is turned on. The existence or magnitude of this read current is amplified by a not shown sense amplifier to identify the logic of the stored data.

By this read operation, the stored data in half of the rows of the memory cells connected to the word line WL2 are read. To read the other half, that is, the memory cells on the right side of the control lines, the relative voltages of the bit lines and the source lines are reversed from FIG. 20. The other conditions are made the same as those in FIG. 20.

That is a read drain voltage vd of, for example, 1.2V, is applied to all source lines SL1 to SL6, a reference voltage Vs, for example, 0V, is applied to all bit lines BL1 to BL6, and a read gate voltage Vwg, for example, the power supply voltage 3.3v, is applied to the selected word line WL2. Further, in a page read operation, a control gate voltage Vcg, for example, 3V, for turning on a channel is applied to all control lines CL1 to CL6.

Therefore, a channel current flows in the opposite polarity to the above and the conductivity of the channel effectively changes reflecting the stored charges of the storage portions at the low electric field side, that is, the storage portions on the right sides of the control lines. Due to this, the stored charges of the storage portions at the low potential side are converted to the amount of read current or the change of the voltage on the source lines where the drain voltage Vd is applied and are read as the stored data.

FIG. 21 shows the specific bias conditions of the read operation in a VG type memory cell array.

The basic procedure of the read operation in a VG memory cell array has already been described in detail in the fourth embodiment. Describing this briefly, all of the bits on one row of memory cells were read out by four reading operations changing the combination of the drain voltage Vd and the reference voltage Vs (or common voltage Vc) applied to the odd-numbered bit lines BL(2n−1) (n: natural number) and even-numbered bit lines BL(2n) and the combination of the ON voltage and OFF voltage applied to the odd-numbered control lines CL(2n−1) and even-numbered control lines CL(2n). The forward bias voltage applied to the gates of the nonselected memory cells does not change in the four reading operations, so FIG. 21 shows the specific bias conditions in the first reading operation in the fourth embodiment as a representative example.

Here, the bits to be read are the bits on the left of the control line CL1, the bits on the right of the control line CL3, and the bits on the right of the control line CL5. To enable this, a reference voltage Vs=0V is applied on the odd-numbered bit lines, a drain voltage Vd=1.2V is applied on the even-numbered bit lines, the ON voltage, namely, Vcg=3v, is applied to the odd-numbered control lines, and the OFF voltage, namely, Vs=0V, is applied on the even-numbered control lines. In addition, a read gate voltage Vwg, namely, the power supply voltage Vcc=3V, is applied to a specified word line WL2, and a forward bias voltage Vuw=−0.5V is applied to the other nonselected word lines WL1, WL3.

Therefore, the channel conductivity effectively changes reflecting the stored charges of the storage portions of the low electric field side, that is, the storage portions on the left sides of the control lines that are turned on. Therefore, the stored charges in the storage portions at the low electric field side are converted to the amount of current read or the amount of change of the bit lines to which the drain voltage is applied and are read as the stored data.

However, in the memory cell structure in the present embodiment, there is a control gate electrode 5 facing the center part of the channel. The control gate electrodes in the column direction are commonly connected as the control lines CL. Accordingly, a voltage is applied in a direction to turn the channel on to the center of the channel in a nonselected memory cell that shares the control line with the memory cell that is to be read. Usually, with this local electric field, the channel is not sufficiently turned on, but the off-leakage current increases somewhat. In particular, in a memory cell where the storage portion to be read is in an erasure state or in an excessively erased state, the threshold voltage falls to lower than usual erasure level, hence the influence of applying a voltage through this control line is no longer negligible.

Generally, in an NOR type memory cell array wherein memory transistors are miniaturized, the off-leakage current flowing to the bit lines from nonselected cells in the read operation is mainly caused by the punch through effect between the source and the drain in a transistor. For example, if the gate length of a memory transistor is made less than 0.13 $\mu$m, even if the read drain voltage is scaled to about 1.0V to 1.5V, the depletion layer extends from the drain side to the source side due to the application of voltage and the drain applied voltage effectively reduces the potential barrier between the source and the substrate or the well. This is called the drain induced barrier lowering (DIBL) effect. Due to this effect, the punch through current increases.

In the read method according to the fifth embodiment, as described above, by applying a forward bias voltage to the gate, this punch through current is suppressed. In the case of an n-channel transistor, applying a negative voltage to the gate acts in a direction to return to the original state the potential barrier at the source side lowered due to the DIBL effect.

According to studies of the inventors, when the sub-threshold coefficient of a memory transistor is 100 mv/decade, if a forward bias voltage of –0.5V is applied in the memory cell array shown in FIG. 20, the leakage current is improved by five orders of magnitude. Further, when the sub-threshold coefficient is 200 mV/decade, applying a forward bias of –0.5V improves the leakage current by two or three orders of magnitude.

Due to such a large improvement of the leakage current, in a nonselected cell, even when the control line shared with a cell to be read is activated and the nonselected cell is turned "ON", not only is the increase of the leakage current due to this suppressed by the application of the forward bias voltage, but the leakage current is conversely reduced. As a result, the SIN ratio of the read signal is improved.

Especially, even when the threshold voltage of the erasure state is a low one of about 0.1V, by setting the voltage Vuw (forward voltage) applied to the nonselected word lines to –0.5V, the leakage current when the read drain voltage is set to 1.2V can be suppressed to below 10 nA/$\mu$m. At this time, since the read current is greater than 50 $\mu$A/$\mu$m, even if the number of the cells in the bit direction is large, it is still sufficiently possible to detect the data by the sense amplifiers.

Further, as a result of various studies, it was found that the smaller the threshold voltage of the erasure state, the forward bias voltage has to be made larger in absolute value. In particular, it was found that even if the erasure state is in a depletion region, it is possible to increase the absolute value of the forward bias voltage to a certain degree to reduce the leakage current and enable a precise read operation.

The value of this forward bias voltage was verified by experiment to be of an extent reducing this off-leakage current, specifically less than 1V in absolute value.

The read method of applying a negative voltage (forward bias voltage Vuw) when the source voltage (reference voltage Vs) is 0V is equivalent to the conventional source bias read method of biasing the source by a positive voltage and making the gate 0V in terms of the relative relation of the source and gate. Accordingly, it is possible to use the read method of the present embodiment together with the source bias read method.

The magnitude of the forward bias voltage Vuw is defined by considering the write disturbance of a nonselected cell.

Thereupon, the inventors studied the read disturbance characteristic at the gate bias voltage of –0.5V. The window of the threshold voltage after 10 years, found by extrapolation of the measured value of the threshold voltage, was larger than 0.5V. From this, it was confirmed that a read operation would be possible in 10 years with a gate bias voltage of –0.5V.

Conversely, the maximum value of the gate bias voltage (forward bias voltage) which can be obtained, found from the limit of the read disturbance, depends on the specifications of the ONO film, but is roughly –1.0V when the tunnel film (bottom dielectric film $6_{-1}$) is 2.6 to 3.0 nm.

In addition., in the present embodiment, in the case of a MONOS transistor using a hot carrier injection write method, it is possible to make the bottom dielectric film $6_{-1}$ a thick 4 nm or so. In this case, by applying a forward bias voltage Vuw up to –1V on the nonselected word lines, the data retention characteristic becomes superior and operation becomes possible without deterioration of the read disturbance.

Due to the above, by applying a forward bias voltage (for example, a negative voltage) on the nonselected word lines at the time of a read operation, it becomes possible to effectively reduce the off-leakage current while securing a read current of a certain magnitude from the nonselected cells. As a result, it is possible to raise the S/N ratio of the read signal and improve the operational reliability of the nonvolatile semiconductor memory.

However, in a nonvolatile semiconductor memory, usually there is a sequence of matching the threshold voltages of erasure states in memory transistors by means of erasure verification. Although it is possible to match the threshold voltages of erasure states in memory transistors, this sequence takes quite a lot of time, therefore it is desired that the verification process be simplified in order to realize high speed write operation cycles. Here, when the threshold voltages of the erasure states are converged to a certain degree, it is preferable from the point of view of increasing write speed to stop the convergence process of the threshold voltages, then reduce the leakage current by changing the bias voltage in the read operation.

In the read method of the present embodiment, the application of a forward bias voltage contributes to increasing the speed of the write cycle in combination with the simplification of the erasure verification process.

Further, the application of a forward bias voltage in the read method of the present invention is not aimed at reducing the leakage current from the depleted nonselected memory transistors, but is for reducing the off-leak current of the nonselected memory transistors in the OFF state to a much lower level even with no gate bias.

When the gate length is made shorter than 0.13 μm, the voltage which can be applied is limited, and the storage capacity in the memory cell array is increased, the read current falls and the off-leakage current derived from the DIBL effect accumulates by the number of nonselected cells and is superposed on the bit lines, so the drop in the S/N ratio of the read signal may become an increasingly serious problem in the future.

By the application of the read method of the present invention, precise reading is possible even in such a situation.

Modifications

While the invention has been described with reference to the first to fifth embodiments for purpose of illustration, it should be apparent that numerous modifications could be made thereto in the art without departing from the basic concept and scope of the invention.

For example, the configuration of the charge storing film of the memory transistor is not restricted to the three-layer dielectric film used in a so-called MONOS type memory transistors as illustrated in the above embodiments. There are two requirements of the charge storing film: that it consists of a stacked plurality of dielectric films and that it is able to retain a charge. Various configurations fulfilling these two points may be applied.

For example, as in a so-called MNOS type, use may be made of a two-layer structure comprising a bottom dielectric film made from silicon dioxide etc. and a film stacked on it, made from silicon nitride etc., and capable of retaining a charge.

It is known that a dielectric film comprised of a metal oxide contains a large number of charge traps. It may be adopted as the film having a charge storing capability in the MONOS type and the MNOS type transistors.

Further, the means of retaining a charge is not restricted to charge traps and may also be conductors. In the most widely known so-called FG type, a conductive film comprised of polycrystalline silicon etc. is sandwiched between two dielectric films. In addition, there is the structure in which fine particle conductors are dispersed on the bottom dielectric film as the charge storing medium and the conductors are buried by a dielectric isolation film.

As a typical example of the latter memory transistor structure, there is a so-called silicon nanocrystal type.

In a silicon nanocrystal type, silicon nanocrystals having a diameter of below 10 nm, for example, about 4.0 nm, are formed and dispersed on a bottom dielectric film comprised of silicon dioxide, silicon oxynitride, etc. The thickness of the bottom dielectric film is in the range of 2.6 nm to 5.0 nm. The distance between the silicon nanocrystals is held at for example about 4.0 nm. A dielectric film such as silicon dioxide is deposited to a thickness of a few nanometers by LP-CVD to cover these spatially dispersed large number of silicon nanocrystals. The thickness of this dielectric film is for example 7 nm or so when the silicon nanocrystals are 4 nm in diameter.

The stacked film formed in this way can be used as the charge storing film having the charge storing capability. Even in this case, by applying a forward bias voltage in the read method of the present embodiment, the off-leakage current from the nonselected cells can be effectively reduced, the S/N ratio of the read signal can be raised, and as a result the operational reliability of the silicon nanocrystal type nonvolatile semiconductor memory can be improved.

Summarizing the effects of the present invention, according to the nonvolatile semiconductor memory device and the methods for operating and producing the same, because the two bits of stored data are reliably distinguished, no dilution of storage occurs when holding the device at a high temperature. Even with over-writing, the sharpness of the distribution of the threshold voltage is not lost. Further, there is resistance to over erasure as well. Therefore a nonvolatile semiconductor memory device having a high operation reliability can be realized. In addition, even with an over-write, because the amount of stored charge does not increase to more than a certain value, the erasure time is also kept as short as possible.

Because the split gate structure is the basic structure, source side injection is possible at the time of a write operation. Compared with the normal CHE injection, the injection efficiency is greatly improved.

Further, when accelerating the carriers in the channel in a write or erasure operation, by raising the potential gradient in the high resistance region under the control gate electrodes, the acceleration voltage can be used to effectively excite carriers while reducing the energy loss when carriers collide with the lattice. Consequently, the efficiency of charge injection into the charge storing film (storage portions of the gate dielectric film) is improved, the write time is shortened, and a nonvolatile semiconductor memory device that is advantageous for lowering the voltages can be realized.

While the write-erasure operation is repeated a certain number of times, even if a charge remains in the region not affected by the electric field of the memory gate electrode, the effect of the unintentional stored charge on the substrate is sufficiently weakened due to the existence of the dielectric isolation layer. As a result, the leakage current is reduced.

The off-leakage current from a nonselected cell that shares a control gate electrode with a selected cell in the memory cell array is reduced by the read method of the present intention which applies a forward bias voltage to the nonselected word lines.

Due to the above, the operational reliability of the nonvolatile semiconductor memory is improved.

Moreover, even if a VG type memory cell array is adopted, serial access in operation is still possible. In particular, in a write operation, because writing to all the memory cells connected to one word line is finished with as low as two write operation cycles, together with the aforesaid reduction of the write time, a nonvolatile semiconductor memory device having very high write performance can be realized.

In a read operation, all the memory cells connected to one word line can be read by four read operation cycles.

In the method of producing the nonvolatile semiconductor memory device according to the present invention, the process of provision of the control gate electrode which gives the above various advantages is achieved just by the addition of two film forming steps and one photolithography step. The process of forming the dielectric isolation film is achieved just by adding one film forming step and one photolithography step. These steps are minor compared with the overall manufacturing process of a nonvolatile semiconductor memory device and do not cause a major increase in costs. Consequently, the bit cost is largely reduced by storing 2 bits of data in a cell and using a VG type cell array.

What is claimed is:

1. A nonvolatile semiconductor memory device comprising:
   a channel forming region comprised of a semiconductor;
   a charge storing film including a plurality of stacked dielectric films and having a charge storing capability;
   two storage portions comprised of regions of the charge storing film overlapping the two ends of the channel forming region;
   a single layer dielectric film contacting the channel forming region between the two storage portions;
   a control gate electrode contacting the single layer dielectric film; and
   a memory gate electrode contacting the two storage portions and having portions contacting the storage portions electrically connected with each other.

2. A nonvolatile semiconductor memory device according to claim 1, wherein the channel forming region comprises:
   two outside channel regions facing said memory gate electrode across said storage portions; and
   an inside channel region located between the two outside channel regions and facing said control gate electrode across said single layer dielectric film, and
   wherein threshold voltages of the three kinds of channel regions of the two outside channel regions and the inside channel region are controlled independently.

3. A nonvolatile semiconductor memory device according to claim 2, wherein said threshold voltages of said two outside channel regions are equal.

4. A nonvolatile semiconductor memory device according to claim 3, wherein said threshold voltages of the two outside channel regions are lower than the threshold voltage of said inside channel region.

5. A nonvolatile semiconductor memory device according to claim 1, wherein said channel forming region comprises:
   two outside channel regions facing said memory gate electrode across said storage portion; and
   an inside channel region located between the two outside channel regions and facing said control gate electrode across said single layer dielectric film, and
   wherein a length of the inside channel region defined by the distance between the two outside channel regions is a length enabling carriers to move quasi-ballistically in a channel formed at the time of operation.

6. A nonvolatile semiconductor memory device according to claim 1, wherein said memory gate electrode intersects said control gate electrode in an electrically insulated state and contacts said storage portions at both the outsides of the control gate electrode.

7. A nonvolatile semiconductor memory device according to claim 6, further comprising on said control gate electrode an etching stop layer comprised of a dielectric with an etching rate lower than that of a conductive material forming said memory gate electrode.

8. A nonvolatile semiconductor memory device according to claim 1,
   further comprising two impurity regions separated from each other from said storage portion sides across said channel forming region and comprised of a semiconductor having a reverse conductivity type to the channel forming region, and
   wherein the two impurity regions are bit lines,
   wherein said memory gate electrode is a word line for controlling operations including input and output of charges to or from the storage portions, and
   wherein the control gate electrode is a control line for assisting the operations.

9. A nonvolatile semiconductor memory device according to claim 1, wherein the memory cell comprises:
   two impurity regions isolated from each other across said channel forming region from the storage portion sides and comprised of a semiconductor having a conductivity type opposite to the channel forming region;
   a control transistor having said control gate electrode as a gate and functioning to make two outside channel regions facing the memory gate electrode across the storage portions the source and the drain; and
   two memory transistors connected in series across said control transistor, each having said memory gate electrode as the gate, and each functioning to make the channel region between the control transistor and one of the two impurity regions as a source or a drain, and wherein:
   a plurality of such memory cells are arranged in a matrix to form a memory cell array;
   each of the two impurity regions is arranged ban longwise in one direction of said memory cell array and is shared among a plurality of memory cells; and
   the control gate electrode is arranged in the space separating the two impurity regions parallel to the impurity regions and is shared among the plurality of memory cells.

10. A nonvolatile semiconductor memory device according to claim 9, wherein each of said two impurity regions is isolated from an impurity region of another memory cell adjoining in a direction perpendicular to the longitudinal direction.

11. A nonvolatile semiconductor memory device according to claim 9, wherein each of said two impurity regions is shared among memory cells adjoining in a direction perpendicular to the longitudinal direction.

12. A nonvolatile semiconductor memory device according to claim 9, wherein memory cells adjoining in one direction are isolated by a dielectric isolation layer.

13. A nonvolatile semiconductor memory device according to claim 12, wherein said dielectric isolation layer is arranged in stripes parallel to said memory gate electrodes beneath a space between the memory gate electrodes.

14. A nonvolatile semiconductor memory device according to claim 12, wherein said dielectric isolation layer is arranged along said memory gate electrodes beneath a space between the memory gate electrodes and separated on said impurity regions.

15. A nonvolatile semiconductor memory device according to claim 12, wherein
   said memory gate electrode has sidewalls at the two sides in the width direction, and
   each of the sidewalls is overlapped with an edge of said dielectric isolation layer across said charge storing film in a region adjoining said storage portion.

16. A method for operating a nonvolatile semiconductor memory device comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film, said operation including a write operation comprising the steps of:

applying a predetermined voltage between the two impurity regions so as to make the impurity region located near the storage portion side to be written the drain and to make the other the source;

applying a specified voltage to each of the memory gate electrode and the control gate electrode to form a channel between the two impurity regions; and injecting part of the carriers injecting in the channel into the drain side storage portion.

17. A method for operation of a nonvolatile semiconductor memory device according to claim 16, comprising, in the step of forming the channel, controlling the values of voltages applied to said memory gate electrode and said control gate electrode to form a channel having a channel resistance beneath said two storage portions different from a channel resistance beneath said single layer dielectric film between the two impurity regions.

18. A method for operating a nonvolatile semiconductor memory device according to claim 16, comprising, in the step of forming the channel, a step of controlling the values of voltages applied to said memory gate electrode and said control gate electrode to generate a high electric field in a channel region beneath the control gate electrode and in a region of the first conductivity type semiconductor beneath a space between the control gate electrode and the memory gate electrode along the direction of charge injection in the channel.

19. A method for operating a nonvolatile semiconductor memory device comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film, said operation including a write operation comprising the steps of:

applying a voltage between the memory gate electrode and the impurity region located at the storage portion side where the data is to be written in a direction so as to invert the impurity region;

generating high energy charges by avalanche breakdown caused in an inversion layer of the impurity region at the time of applying the voltage; and injecting part of the generated high energy charge into the storage portion of the side where data is to be written.

20. A method for operating a nonvolatile semiconductor memory device according to claim 19, comprising, in said write operation, changing the potential in said channel forming region beneath said single layer dielectric film according to the potential of the control gate electrode to control the injection position of the high energy charges.

21. A method for operating a nonvolatile semiconductor memory device according to claim 16 including an erasure operation comprising the steps of:

applying a voltage for inversion of the impurity region between the impurity region located at the side of the storage portion retaining the stored data to be erased and said memory gate electrode;

generating high energy charges of a polarity opposite to the charge injected at the time of the write operation due to avalanche breakdown or a band-to-band tunneling caused at an inversion layer of the impurity region at the time of applying the voltage; and injecting part of the generated high energy charge into the storage portion retaining the stored data.

22. A method for operating a nonvolatile semiconductor memory device according to claim 19 including an erasure operation comprising the steps of:

applying a predetermined voltage between said two impurity regions so as to make the impurity region at the side of the storage portion retaining the stored data to be erased the drain and to make the other impurity region the source;

applying specified voltages to each of the memory gate electrode and the control gate electrode to form a channel between the two impurity regions; and injecting part of the carriers having an opposite polarity to the charge injected at the time of the write operation and injecting in the channel into the storage portion retaining the stored data to be erased.

23. A method for operating a nonvolatile semiconductor memory device according to claim 22, comprising, in the step of forming the channel, a step of controlling the values of voltages applied to said memory gate electrode and said control gate electrode to form a channel having a channel resistance beneath said two storage portions different from a channel resistance beneath said single layer dielectric film between the two impurity regions.

24. A method for operating a nonvolatile semiconductor memory device according to claim 16 including a read operation comprising the steps of:

applying a voltage between said two impurity regions so as to make the impurity region at the side of the storage portion retaining the stored data to be read the source and to make the other impurity region the drain;

applying specified voltages to each of said memory gate electrode and said control gate electrode; and changing the presence or absence of charge or the difference of amount of charge in the storage portion according to the stored data into the amount of current flowing in the channel forming region or the amount of change of voltage of the impurity regions to read the stored data.

25. A method for operating a nonvolatile semiconductor memory device according to claim 19 including a read operation comprising the steps of:

applying a voltage between said two impurity regions so as to make the impurity region at the side of the storage portion retaining the stored data to be read the source and to make the other impurity region the drain;

applying specified voltages to each of said memory gate electrode and said control gate electrode; and changing the presence or absence of charge or the difference of amount of charge in the storage portion according to the stored data into the amount of current flowing in the channel forming region or the amount of change of voltage of the impurity region to read the stored data.

26. A method for operating a nonvolatile semiconductor memory device comprising memory cells arranged in a matrix to form a memory cell array, each of said memory cell comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrode being shared among a plurality of cells in the direction of separation of the impurity regions and comprising a word line; each of the two impurity regions being shared among a plurality of cells in the direction perpendicular to the word line and comprising a bit line; and the control gate electrode being arranged in parallel to the bit line and shared among a plurality of cells in a direction perpendicular to the word line, said method including a read operation comprising a step of applying a voltage of a direction giving a forward bias to the channel forming region to a nonselected word line in a row not including the memory cell to be read.

27. A method for operating a nonvolatile semiconductor memory device according to claim 26, wherein said memory cell has two storage portions at the sides of the two impurity regions and, in said memory cell, a control transistor having a control gate electrode as a gate and functioning to make two outside channel regions facing said memory gate electrode across the two storage portions the source and drain and two memory transistors having said memory gate electrode as a gate and functioning to make the channel region of the control transistor and one of the two impurity regions the source or drain connected in series across the control transistor.

28. A method for operating a nonvolatile semiconductor memory device according to claim 26 comprising, in the step of applying a voltage of a direction giving a forward bias, a step of applying a minus side voltage with respect to the source voltage to the nonselected word line when said channel forming region is a p-type semiconductor.

29. A method for operating a nonvolatile semiconductor memory device according to claim 26, wherein said voltage of a direction giving a forward bias is a value within a voltage range where memory cells connected to a nonselected word line and arranged in the same column as the memory cell to be read are not read erroneously.

30. A method for operating a nonvolatile semiconductor memory device according to claim 26, wherein an absolute value of said voltage in a direction giving a forward bias is smaller than 1V.

31. A method for operating a nonvolatile semiconductor memory device comprising a plurality of memory cells arranged in a matrix to form a memory cell array, each of said memory cell comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrodes in the same row being connected by a word line; each of the two impurity regions being arranged longwise in the column direction and shared between memory cells adjoining in the row direction; and the control gate electrode being arranged longwise in the column direction and shared between memory cells in the same column, said method comprising the steps of:

driving the control gate electrodes to divide the memory cell array electrically; and driving the impurity regions and the word lines to write, read, or erase data in parallel a plurality of cells in the divided memory cell array.

32. A method for operating a nonvolatile semiconductor memory device according to claim 31 wherein said write or erasure operation comprises the steps of:

applying a predetermined voltage between said two impurity regions so as to make the impurity region at the side of the storage portion where memory data is to be written the drain and to make the other impurity region the source;

applying specified voltages to said memory gate electrode and said control gate electrode to form a channel between the two impurity regions; and injecting part of the carriers injecting in the channel into the drain side storage portion.

33. A method for operating a nonvolatile semiconductor memory device according to claim 32, comprising, in said step of forming a channel, a step of controlling the values of voltages applied to said memory gate electrode and said control gate electrode to form a channel having a channel resistance beneath said two storage portions different from a channel resistance beneath said single layer dielectric film between the two impurity regions.

34. A method for operating a nonvolatile semiconductor memory device according to claim 31, comprising the steps of:

applying at every certain number of control gate electrodes an off voltage for shifting a memory cell to an inactive state where the channel is unable to be turned on;

writing, reading, or erasing in parallel memory cells in the active state between memory cells placed in the inactive state due to the division; and repeating the step of dividing the memory cell array and the step of writing, reading, or erasing the memory cells in the active state while shifting the control gate electrodes to which the off voltage is applied in one direction.

35. A method for operating a nonvolatile semiconductor memory device comprising a plurality of memory cells arranged in a matrix to form a memory cell array, each of said memory cell comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrodes in the same row being connected by a word line; each of the two impurity regions being arranged longwise in the column direction and shared between memory cells adjoining in the row direction; and the control gate electrode being arranged longwise in the column direction and shared between memory cells in the same column, the method including a write operation comprising the steps of:

alternately applying a write drain voltage and a reference voltage to the impurity regions in the memory cell array;

applying an ON voltage for shifting a channel from an OFF state to a possible ON state to the control gate electrode in combination according to the data to be written;

selecting a storage portion located between the control gate electrode applied with the ON voltage and the impurity region applied with the write drain voltage;

applying a specified voltage to a word line of a selected row in which the data is to be written to turn the channel on beneath the selected storage portion and injecting part of the carriers injecting in the channel in the selected storage portion;

reapplying the write drain voltage and reference voltage to the impurity regions in the memory cell array while switching the locations of application;

reapplying the ON voltage to the control gate electrode in combination according to the data to be written;

selecting the remaining storage portion different from above storage portion; and reapplying the voltage to the word line and turning the channel on beneath the selected storage portion and injecting part of the carriers injecting in the channel in the selected storage portion.

36. A method for operating a nonvolatile semiconductor memory device according to claim 35, comprising the steps of:

fixing the potential of the impurity regions and in that state successively selecting the word line to which the memory cell to be written with data is connected and repeating the selection of the storage portion and the injection of carrier into the selected storage portion while changing the application of the ON voltage to the control gate electrode according to the data to be written for each selected word line for all word lines in the memory cell array;

reapplying the write drain voltage and reference voltage to the impurity regions in the memory cell array while switching the locations of application; and fixing the potential of the impurity regions and in that state successively selecting the word line to which the memory cell to be written with data is connected and repeating the selection of the storage portion and the injection of carrier into the selected storage portion while changing the application of the ON voltage to the control gate electrode according to the data to be written for each selected word line for all word lines in the memory cell array.

37. A method for operating a nonvolatile semiconductor memory device comprising a plurality of memory cells arranged in a matrix to form a memory cell array, each of said memory cell comprising a channel forming region comprised of a first conductivity type semiconductor, two impurity regions comprised of a second conductivity type semiconductor and separated from each other across the channel forming region, a charge storing film including a plurality of stacked dielectric films and having a charge storing capability, two storage portions comprised of regions of the charge storing film overlapping with two ends of the channel forming region at the two impurity region sides, a single layer dielectric film contacting the channel forming region between the storage portions, a memory gate electrode contacting the storage portions, and a control gate electrode on the single layer dielectric film; the memory gate electrodes in the same row being connected by a word line; each of the two impurity regions being arranged longwise in the column direction and shared between memory cells adjoining in the row direction; and the control gate electrode being arranged longwise in the column direction and shared between memory cells in the same column, said method having a read operation comprising the steps of:

a first reading step of reading one storage portion in the odd-numbered memory cells included in the same row of the memory cell array;

a second reading step of reading the other storage portion of the odd-numbered memory cells included in the same row;

a third reading step of reading one storage portion of even-numbered memory cells included in the same row; and a fourth reading step of reading the other storage portion of the even-numbered memory cells included in the same row.

38. A method for operating a nonvolatile semiconductor memory device according to claim 37, wherein said read operation comprises the steps of:

resetting to apply a reference voltage to all of the impurity regions and apply an OFF voltage to all of the control gate electrodes;

selecting the odd-numbered memory cells or the even-numbered memory cells by alternately applying to the control gate electrodes in the memory cell array an ON voltage for shifting a channel from an OFF state to a possible ON state and an OFF voltage for holding the channel in the OFF state;

changing the memory cells selected by switching the application of the ON voltage and the OFF voltage;

alternatively applying to the impurity regions in the memory cell array the reference voltage and the read drain voltage so as to select a pair of the storage portions on the two sides of an impurity region to which the reference voltage is applied; and changing the pair of storage portions selected by switching the application of the reference voltage and the read drain voltage.

39. A method for operating a nonvolatile semiconductor memory device according to claim 38, wherein a read operation on a plurality of memory cells in the same row comprises the steps of:

resetting;

selecting a pair of storage portions;

performing a first reading operation by selecting a memory cell;

performing a second reading operation by changing the memory cell selected;

resetting;

performing a third reading operation by selecting a memory cell; and performing a fourth reading operation by changing the memory cell selected.

40. A method for operating a nonvolatile semiconductor memory device according to claim 37, comprising the steps of:

performing one of said first to fourth reading steps repeatedly on all of the word lines in the memory cell array while fixing the voltage application conditions of the impurity regions and the control gate electrodes;

changing the voltage application conditions of the impurity regions and the control gate electrodes to enable selection of any of the remaining steps among the first to fourth reading steps; and repeatedly performing the reading steps under constant voltage application conditions for all rows in the memory cell array and the step of changing the voltage application conditions until all of the storage portions in the memory cell array finish being read.

* * * * *

UNITED STATES PATENT AND TRADEMARK OFFICE
CERTIFICATE OF CORRECTION

PATENT NO. : 6,721,205 B2
DATED : April 13, 2004
INVENTOR(S) : Toshio Kobayashi

It is certified that error appears in the above-identified patent and that said Letters Patent is hereby corrected as shown below:

Column 38,
Line 21, delete "ban".

Signed and Sealed this

Seventh Day of December, 2004

JON W. DUDAS
*Director of the United States Patent and Trademark Office*